US012685232B2

(12) United States Patent
Park et al.

(10) Patent No.: US 12,685,232 B2
(45) Date of Patent: Jul. 14, 2026

(54) STACKED SEMICONDUCTOR DEVICE

(71) Applicant: SK hynix Inc., Gyeonggi-do (KR)

(72) Inventors: Jae Hyung Park, Gyeonggi-do (KR);
Seung Geun Baek, Gyeonggi-do (KR);
Dong Uk Lee, Gyeonggi-do (KR)

(73) Assignee: SK hynix Inc., Gyeonggi-do (KR)

( * ) Notice: Subject to any disclaimer, the term of this
patent is extended or adjusted under 35
U.S.C. 154(b) by 88 days.

(21) Appl. No.: 18/747,448

(22) Filed: Jun. 19, 2024

(65) Prior Publication Data

US 2024/0339438 A1     Oct. 10, 2024

Related U.S. Application Data

(63) Continuation-in-part of application No. 17/884,963,
filed on Aug. 10, 2022, now Pat. No. 12,094,555.

(30) Foreign Application Priority Data

Mar. 15, 2022     (KR) ........................ 10-2022-0031987

(51) Int. Cl.
*G11C 11/408*          (2006.01)
*G11C 11/4093*          (2006.01)
(Continued)

(52) U.S. Cl.
CPC ...... H01L 25/0657 (2013.01); G11C 11/4087
(2013.01); G11C 11/4093 (2013.01);
(Continued)

(58) Field of Classification Search
CPC ...... H01L 25/0657; H01L 2225/06513; H10B
80/00; G11C 11/4087; G11C 11/4093;
G11C 11/4096
(Continued)

(56) References Cited

U.S. PATENT DOCUMENTS

| | | |
|---|---|---|
| 11,177,005 B2 | 11/2021 | Oh |
| 11,694,940 B1 | 7/2023 | Mathuriya et al. |

(Continued)

FOREIGN PATENT DOCUMENTS

| | | |
|---|---|---|
| KR | 10-2016-0006867 A | 1/2016 |
| KR | 10-2021-0013870 A | 2/2021 |

OTHER PUBLICATIONS

Notice of Allowance for U.S. Appl. No. 17/884,963 issued by the
United States Patent and Trademark Office on Jul. 30, 2024.
(Continued)

*Primary Examiner* — Ly D Pham
(74) *Attorney, Agent, or Firm* — IP & T GROUP LLP

(57) ABSTRACT

A stacked semiconductor device includes at least one upper
chip including first and second channels, each including first
and second pseudo-channels; and first and second transfer
control circuits respectively corresponding to the first and
second channels, each configured to select one of the first
and second pseudo-channels according to a channel desig-
nation signal designating one of the first and second pseudo-
channels and a location information signal indicating a
location of a corresponding channel, and transfer a data
word between the selected pseudo-channel and a lower chip,
wherein the first transfer control circuit transfers the data
word in a first order in units of bytes, and the second transfer
control circuit transfers the data word in a second order in
units of bytes, opposite to the first order.

15 Claims, 16 Drawing Sheets

(51) Int. Cl.

| | |
|---|---|
| *G11C 11/4096* | (2006.01) |
| *H01L 25/065* | (2023.01) |
| *H10B 80/00* | (2023.01) |

(52) U.S. Cl.
CPC .......... *G11C 11/4096* (2013.01); *H10B 80/00* (2023.02); *H01L 2225/06513* (2013.01)

(58) Field of Classification Search
USPC .................................................. 365/189.011
See application file for complete search history.

(56) References Cited

U.S. PATENT DOCUMENTS

| | | | |
|---|---|---|---|
| 11,967,381 | B2 | 4/2024 | Chae et al. |
| 2013/0135915 | A1 | 5/2013 | Kim |
| 2019/0004909 | A1 | 1/2019 | Alameer et al. |
| 2020/0272560 | A1 | 8/2020 | Keeth et al. |
| 2021/0216238 | A1* | 7/2021 | Nale ..................... G06F 3/0655 |
| 2021/0217763 | A1 | 7/2021 | Lee |
| 2021/0225827 | A1 | 7/2021 | Lanka et al. |
| 2022/0011960 | A1* | 1/2022 | Tan ........................ G11C 7/109 |
| 2022/0075541 | A1* | 3/2022 | Kwon ................... G06F 3/0659 |
| 2022/0137843 | A1 | 5/2022 | Vogelsang et al. |
| 2022/0206869 | A1 | 6/2022 | Ramachandran et al. |
| 2022/0292033 | A1 | 9/2022 | Yu et al. |
| 2023/0170037 | A1 | 6/2023 | Suh |
| 2023/0284456 | A1 | 9/2023 | Dokania et al. |

OTHER PUBLICATIONS

Office Action for Korean Patent Application No. 10-2022-0031987 issued by the Korean Patent Office on Aug. 27, 2025.
Notice of Allowance for Korean Patent Application No. 10-2022-0031987 issued by the Korean Patent Office on Feb. 26, 2026.
Notice of Allowance for the U.S. Appl. No. 18/746,052 issued by the United States Patent and Trademark Office on Apr. 8, 2026.

* cited by examiner

STACKED SEMICONDUCTOR DEVICE

CROSS-REFERENCE TO RELATED APPLICATIONS

The present application is a Continuation-In-Part of U.S. patent application Ser. No. 17/884,963 filed on Aug. 10, 2022, which claims priority under 35 U.S.C. § 119(a) to Korean Patent Application No. 10-2022-0031987, filed on Mar. 15, 2022, which are incorporated herein by reference in their entirety.

BACKGROUND

1. Field

Various embodiments of the present disclosure relate to semiconductor design technology, and more particularly, to an interface method of a stacked semiconductor device operating with a plurality of channels.

2. Description of the Related Art

As semiconductor technology makes dramatic progress, semiconductor integrated devices such as packages are required to have a higher degree of integration and performance. To this end, current technology is moving away from a two-dimensional structure in which semiconductor chips are arranged on one plane over a printed circuit board (PCB) by using wires or bumps. Instead, new diverse technologies related to a three-dimensional structure in which a plurality of semiconductor chips are vertically stacked are emerging.

The three-dimensional structure may be implemented by a stacked semiconductor device in which a plurality of semiconductor chips are vertically stacked. The semiconductor chips stacked in a vertical direction are electrically connected to each other through through-electrodes (e.g., through-silicon-vias, TSVs) and mounted on a semiconductor packaging substrate.

Furthermore, each of the semiconductor chips constituting the stacked semiconductor device may constitute one or more channels. The channels of each of the semiconductor chips may receive different control signals or data and may operate independently from each other.

SUMMARY

Embodiments of the present disclosure are directed to a stacked semiconductor device capable of providing an interface between a base chip and core chips having different channel structures in the stacked semiconductor device operating with a plurality of channels.

In accordance with an embodiment of the present disclosure, a stacked semiconductor device at least one upper chip including a plurality of channels each including first and second pseudo-channels; and a plurality of transfer control circuits respectively corresponding to the channels and each configured to output channel commands according to a channel designation signal designating one of the first and second pseudo-channels and a location information signal indicating a location of a corresponding channel of the channels, and transmit first and second data words between the corresponding channel and a lower chip according to the channel commands.

In accordance with an embodiment of the present disclosure, a stacked semiconductor device includes at least one core chip including a plurality of channels each including first and second pseudo-channels and a plurality of transfer control circuits respectively corresponding to the channels; and a base chip including a plurality of channel interfaces respectively corresponding to the channels, and divided into at least one first-side channel interface and at least one second-side channel interface, the base chip configured to transmit, through the first-side channel interface, first and second data words respectively to first and second through-electrodes, and transmit, through the second-side channel interface, the second and first data words respectively to the first and second through-electrodes, wherein each of the transfer control circuits is selectively swap first and second channel commands according to an arrangement of a corresponding channel interface of the channel interfaces, transfer a first core data word between the first through-electrode and the first pseudo-channel according to the first channel command, and transfer a second core data word between the second through-electrode and the second pseudo-channel according to the second channel command.

In accordance with an embodiment of the present disclosure, a semiconductor device includes first and second stacked chips, wherein the first chip includes: first and second interfaces each configured to transfer a data word between an exterior and the second chip, the data word exchanged between the external and the first interface being symmetrical, in units of bytes, to the data word exchanged between the external and the second interface; and a repeater configured to invert, in units of bytes, a sequence of the data word transferred between the second interface and the second chip, and wherein the second chip includes: first and second channels corresponding to the respective first and second interfaces, each having first and second pseudo-channels; and first and second control circuits corresponding to the respective first and second interfaces, each configured to select, based on a signal indicating one of the first and second pseudo-channels within a corresponding one of the first and second channels, one of the first and second pseudo-channels according to a corresponding one of the first and second interfaces, and transfer the data word between the selected pseudo-channel and the corresponding interface.

In accordance with an embodiment of the present disclosure, a staked semiconductor device includes at least one upper chip including first and second channels, each including first and second pseudo-channels; and first and second transfer control circuits respectively corresponding to the first and second channels, each configured to select one of the first and second pseudo-channels according to a channel designation signal designating one of the first and second pseudo-channels and a location information signal indicating a location of a corresponding channel, and transfer a data word between the selected pseudo-channel and a lower chip, wherein the first transfer control circuit transfers the data word in a first order in units of bytes, and the second transfer control circuit transfers the data word in a second order in units of bytes, opposite to the first order.

In accordance with an embodiment of the present disclosure, a semiconductor device includes a first chip including first and second interfaces each configured to transfer a data word to or from an exterior; and a second chip including: first and second channels, each having first and second pseudo-channels; and first and second transfer control circuits corresponding to the respective first and second interfaces, each configured to select, based on a channel designation signal indicating one of the first and second pseudo-channels within a corresponding channel, one of the first and second pseudo-channels according to a location of the corresponding interface, and transfer the data word between the selected pseudo-channel and the corresponding interface, wherein the data word is transferred by the first interface between the first chip and the second chip in a first order in units of bytes, and the data word is transferred by the second interface between the first chip and the second chip in a second order in units of bytes, opposite to the first order.

According to embodiments of the present invention, an interface between the base chip having channel interfaces of a mirror structure and the core chips having channels of a shift structure may be provided, thereby minimizing skew that may occur in signal transmission of the stacked semiconductor device and improving operation reliability.

These and other features and advantages of the present disclosure will become apparent to those skilled in the art from the following detailed description in conjunction with the following drawings.

BRIEF DESCRIPTION OF THE DRAWINGS

FIG. 4 is a configuration diagram illustrating a structure of data input through channel interfaces on the base chip of FIG. 3 in accordance with an embodiment of the present invention.

FIG. 5 is a configuration diagram illustrating one of the core chips of FIG. 2 in accordance with an embodiment of the present invention.

FIG. 7 is a diagram for describing data transferred between a base chip and core chips through through-electrodes of FIG. 6 in accordance with an embodiment of the present invention.

DETAILED DESCRIPTION

Figure 1:
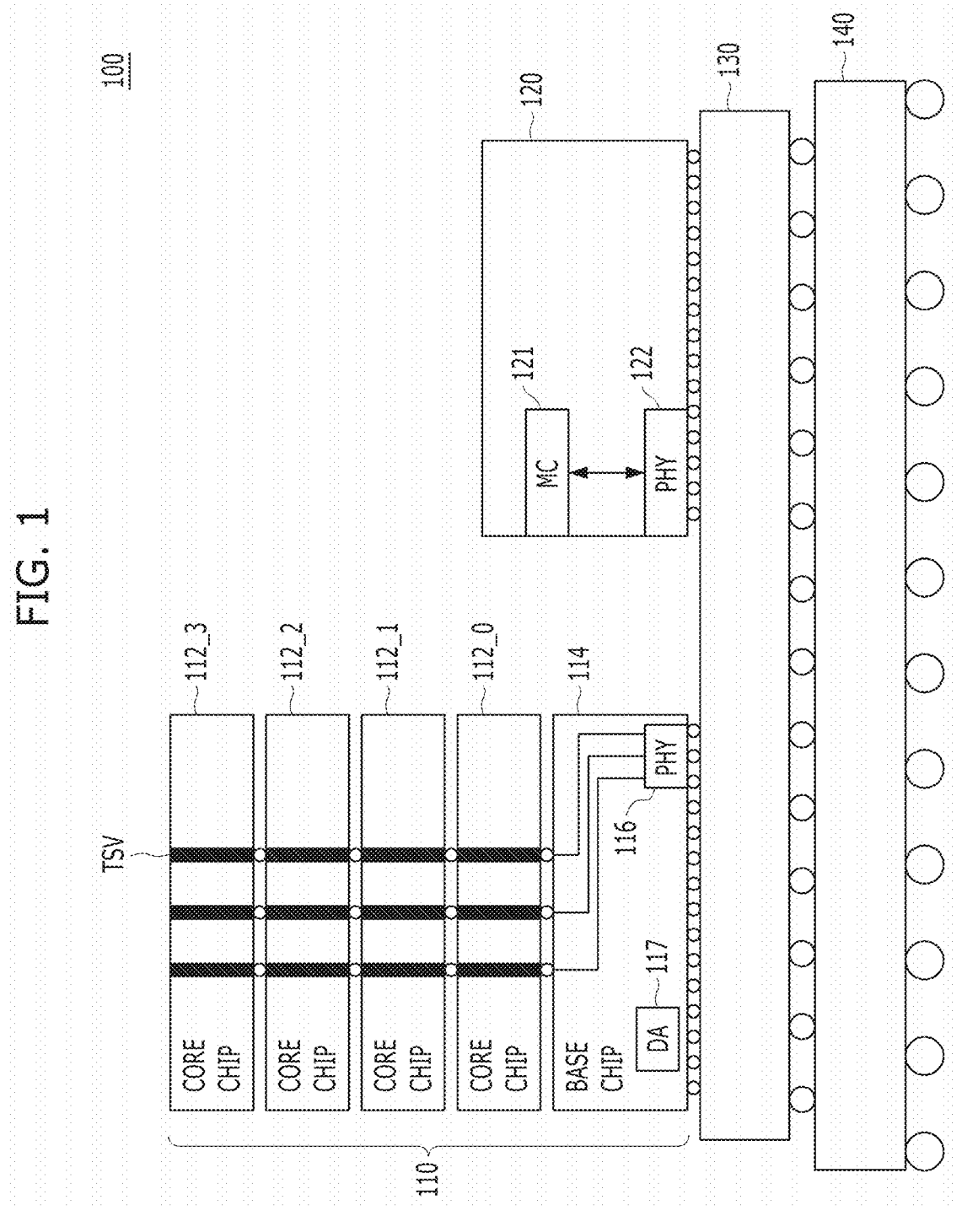
FIG. 1 is a cross-sectional diagram illustrating a semiconductor system including a stacked memory device in accordance with an embodiment of the present invention.

Various embodiments of the present teachings will be described below in more detail with reference to the accompanying drawings. The present teachings may, however, be embodied in different forms and should not be construed as being limited to the embodiments set forth herein. Rather, these embodiments are provided so that this disclosure will convey the scope of the present teachings to those skilled in the art. Throughout this disclosure, like reference numerals refer to like parts throughout the various figures and embodiments of the present teachings.

It is noted that reference to "an embodiment," "another embodiment," or the like does not necessarily mean only one embodiment, and different references to any such phrase are not necessarily to the same embodiment(s).

It will be understood that, although the terms "first," "second," "third," and so on may be used herein to describe various elements, these elements are not limited by these terms. These terms are used to distinguish one element from another element. Thus, a first element described below could also be termed a second or third element without departing from the spirit and scope of the present teachings.

It will be further understood that the terms "comprises," "comprising," "includes," and "including" when used in this specification, specify the presence of the stated elements and do not preclude the presence or addition of one or more other elements. As used herein, the term "and/or" includes any and all combinations of one or more of the associated listed items.

As used herein, singular forms may include the plural forms as well, and vice versa, unless the context clearly indicates otherwise. The articles 'a' and 'an' as used in this application and the appended claims should generally be construed to mean 'one or more' unless specified otherwise or it is clear from context to be directed to a singular form.

Hereinafter, a semiconductor system including a stacked semiconductor device will be described. The semiconductor system in accordance with the embodiment of the present teachings may be embodied in the form of a system-in-package, a multi-chip package, or a system-on-chip, and it may also be embodied in the form of a package-on-package. Hereinafter, a memory system including a stacked memory device will be described as an example of a stacked semiconductor device.

FIG. 1 is a cross-sectional diagram illustrating a semiconductor system 100 including a stacked memory device 110 in accordance with various embodiments of the present invention.

Referring to FIG. 1, the semiconductor system 100 may include the stacked memory device 110, a controller 120, an interposer 130, and a package substrate 140.

The interposer 130 may be mounted onto the package substrate 140.

The stacked memory device 110 and the controller 120 may be mounted onto the interposer 130.

The processor 120 may include a memory controller 121 and a physical (PHY) interface 122 for an interface with the memory controller 121. The PHY interface 122 may be used by the memory controller 121 to communicate with the stacked memory device 110. The processor 120 may be one among various processors, such as a Graphic Processing Unit (GPU), a Central Processing Unit (CPU), and an Application Processor (AP).

The stacked memory device 110 may include a base chip 114 and core chips 112_0 to 112_3 that are stacked over the base chip 114. The base chip 114 may be referred to as a lower chip and the core chips 112_0 to 112_3 may be referred to as an upper chip. The base chip 114 may be also referred to as a buffer die. An example of the stacked memory device 110 formed by stacking a plurality of chips as described above may be a high bandwidth memory (HBM).

Each of the core chips 112_0 to 112_3 may include a memory cell array for storing data and circuits for writing data to and reading data from the memory cell array. The base chip 114 may include circuits for the interface between the core chips 112_0 to 112_3 and the base chip 114 and circuits for the interface between the base chip 114 and the memory controller 121. A plurality of through-electrodes TSVs may be formed between the stacked core chips 112_0 to 112_3, and through the through-electrodes TSVs, commands, addresses and data may be transferred between the core chips 112_0 to 112_3 and the base chip 114.

The PHY interface 116 of the base chip 114 may be an interface for communication between the base chip 114 and the memory controller 121, and a direct access (DA) interface 117 may be an interface for testing the stacked memory device 110. The PHY interface 116 may be coupled to the interposer 130 through micro bumps, and the interposer 130 may electrically connect the PHY interface 116 of the base chip 114 to the PHY interface 122 of the memory controller 121 through internal interconnections (not shown). Further, the PHY interfaces 116 and 122 may be electrically connected to communicate with each other through the interposer 130. The PHY interface 116 may be coupled to the interposer 130 through more than 1000 micro bumps. Since the physical number of the micro bumps is very large, in reality, it is very difficult to test the stacked memory device 110 by using the PHY interface 116. For this reason, the DA interface 117 interfaced by using direct access pads whose number is relatively smaller than that of the micro bumps and whose physical size is relatively larger than those of the micro bumps may be used for testing the stacked memory device 110.

The package substrate 140 may include solder balls for supplying power to the stacked memory device 110 and the processor 120 and solder balls for the processor 120 to communicate with the outside (e.g., other chips on a graphics card). The package substrate 140 may be coupled to, for example, a graphic card.

Figure 2:
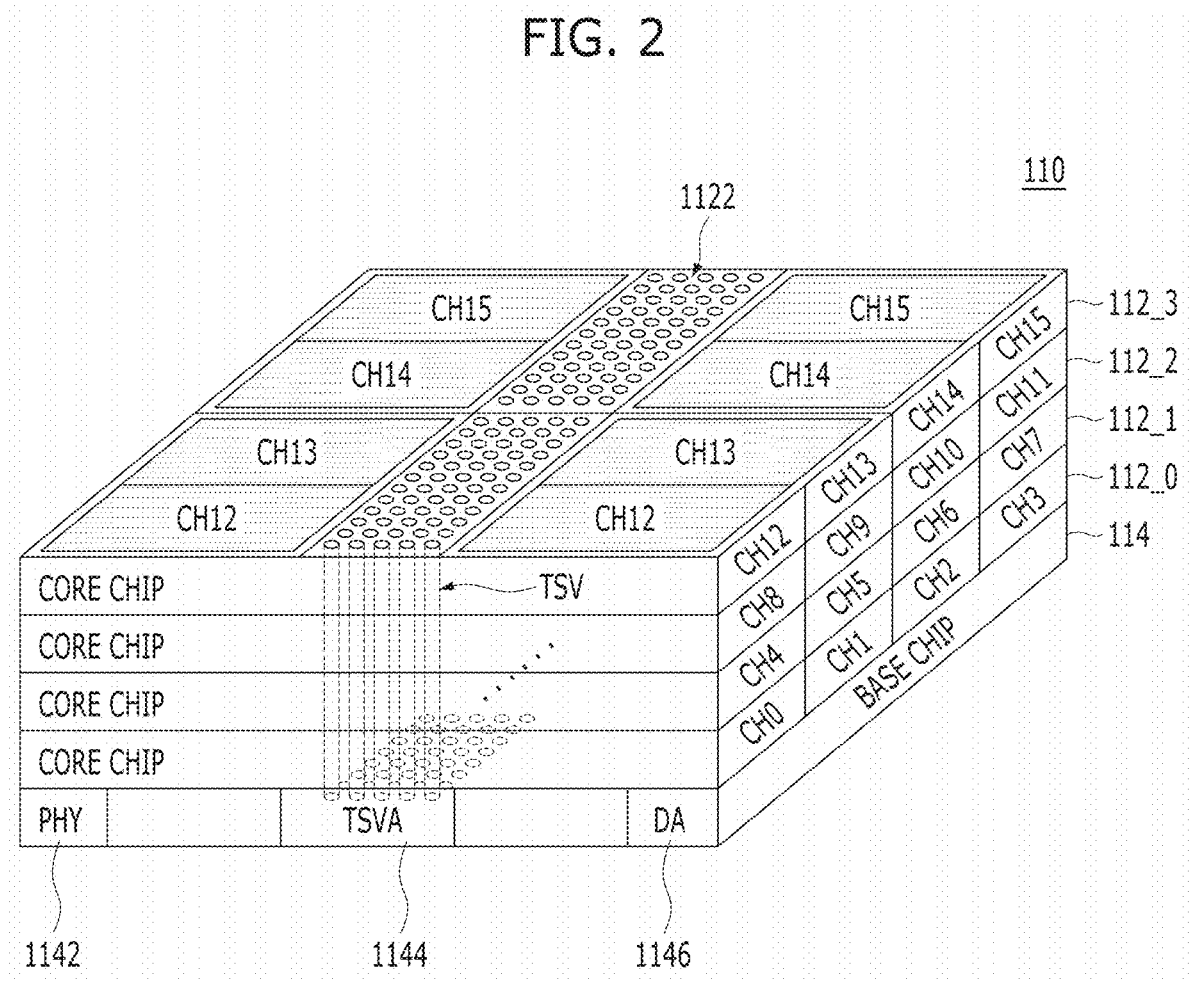
FIG. 2 is a perspective view illustrating the stacked memory device shown in FIG. 1 in accordance with an embodiment of the present invention.

FIG. 2 is a perspective view illustrating the stacked memory device 110 shown in FIG. 1 in accordance with an embodiment of the present invention.

Referring to FIG. 2, each of the first to fourth core chips 112_0 to 112_3 may include two or more channels. In the example of FIG. 2, as one core chip includes four channels, the stacked memory device 110 may have first to 16th channels CH0 to CH15. For example, the first core chip 112_0 may include memory areas corresponding to the first to fourth channels CH0 to CH3, and the second core chip 112_1 may include memory areas corresponding to the fifth to eighth channels CH4 to CH7. The third core chip 112_2 may include memory areas corresponding to the ninth to 12th channels CH8 to CH11, and the fourth core chip 112_3 may include memory areas corresponding to the 13th to 16th channels CH12 and CH15.

Further, a plurality of through-electrodes TSVs passing through the first to fourth core chips 112_0 to 112_3 may be disposed corresponding to the first to 16th channels CH0 to CH15, respectively. When each channel has a bandwidth of 64 bits, the through-electrodes TSVs and corresponding I/O units may be configured to transfer 1024 bits of data.

The base chip 114 may communicate with the memory controller (121 of FIG. 1). For example, the base chip 114 may receive commands, addresses, and data from the memory controller 121, and provide the received commands, addresses, and data to the first to fourth core chips 112_0 to 112_3.

A physical area (PHY) 1142, a TSV area (TSVA) 1144, and a direct access area (DA) 1146 may be disposed in the base chip 114. The physical area (PHY) 1142 may be the same part as the physical area (PHY) 1142 shown in FIG. 1, and the direct access area (DA) 1146 may be the same part as the direct access area (DA) 1146 shown in FIG. 1.

The physical area 1142 may be provided with an I/O circuit for interfacing with the controller 120. The physical area 1142 may be disposed in a first edge area of the base chip 114, adjacent to the controller 120. The direct access area 1146 may be provided with an I/O circuit for directly interfacing with an external test device (not shown). The direct access area 1146 may be disposed in a second edge area of the base chip 114, adjacent to the external test device. The second edge area may be disposed in a direction which is opposite to the first edge area. The TSV area 1144 may be an area for interfacing with the through-electrodes TSVs passing through the first to fourth core chips 112_0 to 112_3. The TSV area 1144 may be disposed between the physical area 1142 and the direct access area 1146, that is, the TSV area 1144 may be disposed at the central area of the base chip 114.

The physical area 1142 may transfer signals received from the controller 120 to the TSV area 1144. The direct access area 1146 may transfer a test signal received from the external test device to the TSV area 1144. The TSV area 1144 may perform a predetermined signal processing operation, for example, a buffering operation, on the signal received from the physical area 1142 or the test signal received from the direct access area 1146 to transfer the buffered signals to the first to fourth core chips 112_0 to 112_3 through the through-electrodes TSVs.

Meanwhile, in order to increase the bandwidth of the stacked memory device 110, each of the first to 16th channels CH0 to CH15 may include one or more pseudo-channels that operate independently. For example, when each channel includes two pseudo-channels, the stacked memory device 110 may enter a pseudo-channel mode and operate by being divided into 32 channel units. That is, in the pseudo-channel mode, two pseudo-channels of each of the first to 16th channels CH0 to CH15 may form independent channels, respectively. The pseudo-channels may share command/address and clock signals, but may decode and execute commands independently. For example, if one channel supports a bandwidth of 64 bits, each of the pseudo-channels may support a bandwidth of 32 bits. For example, when one channel includes 32 memory banks, each of the pseudo-channels may include 16 memory banks.

Figure 3:
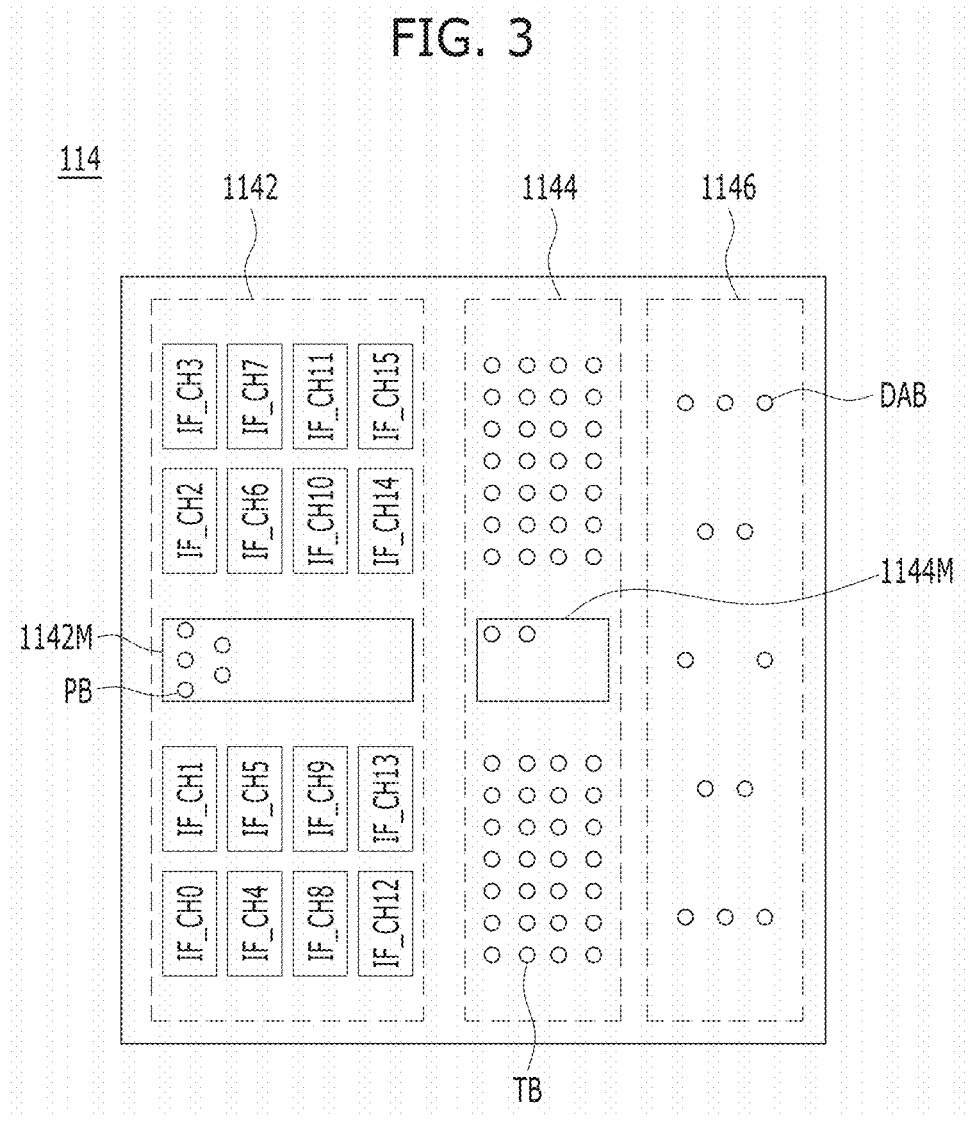
FIG. 3 is a plane view for describing a base chip shown in FIG. 2 in accordance with an embodiment of the present invention.

FIG. 3 is a plane view for describing the base chip 114 shown in FIG. 2 in accordance with an embodiment of the present invention.

Referring to FIG. 3, the physical area 1142, the TSV area 1144, and the direct access area 1146 may be disposed in the base chip 114.

In the physical area 1142, channel interface (IF_CH0 to IF_CH15) areas for interfacing with the first to 16th channels CH0 to CH15 of the first to fourth core chips 112_0 to 112_3, and a middle physical area 1142M for interfacing with the direct access area 1146 may be disposed. In the channel interface (IF_CH0 to IF_CH15) areas, a plurality of PHY bumps PB_N may be formed to interface with the memory controller 121. In the middle physical area 1142M, a plurality of PHY bumps PB may be formed to interface with the direct access area 1146 or to interface with control signals and input/output signals regarding IEEE 1500 standard for embedded core testing.

Moreover, based on the middle physical area 1142M, left channel interfaces and right channel interfaces may be distinguished. For example, the left channel interfaces include a first channel interface IF_CH0, a second channel interface IF_CH1, a fifth channel interface IF_CH4, a sixth channel interface IF_CH5, a ninth channel interface IF_CH8, a tenth channel interface IF_CH9, a 13th channel interface CH12, and a 14th channel interface IF_CH13. The right channel interfaces include a third channel interface IF_CH2, a fourth channel interface IF_CH3, a seventh channel interface IF_CH6, an eighth channel interface IF_CH7, a 11th channel interface IF_CH10, a 12th channel interface IF_CH11, a 15th channel interface CH14, and a 16th channel interface IF_CH15. In an embodiment of the present invention, channels (i.e., CH0, CH1, CH4, CH5, CH8, CH9, CH12, and CH_13) of the core chips 112_0 to 112_3 corresponding to the left channel interfaces may be defined as left channels, and channels (i.e., CH2, CH3, CH6, CH7, CH10, CH11, CH14, and CH_15) of the core chips 112_0 to 112_3 corresponding to the right channel interfaces may be defined as right channels.

In the TSV area 1144, a plurality of TSV bumps TB may be formed to interface with the through-electrodes TSVs. In addition, in the TSV area 1144, a middle TSV area 1144M in which TSV bumps TB for transmitting signals related to boot-up (e.g., a boot-up signal or a power-up signal) and test signals are formed, may be disposed.

In the direct access area 1146, a plurality of DA bumps DAB may be formed to interface with the external test device to directly access and test the stacked memory device 110.

Figure 4:
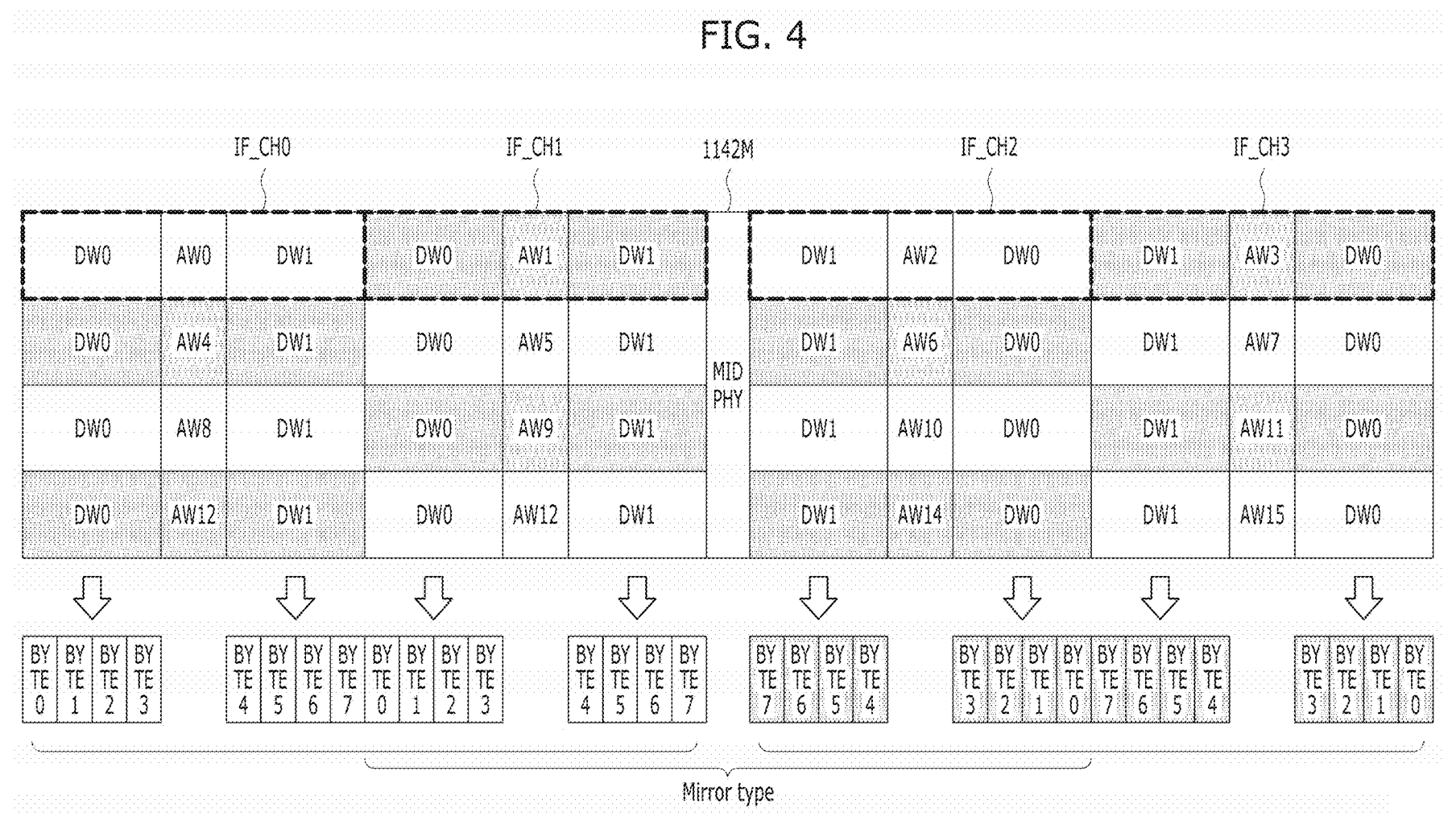

FIG. 4 is a configuration diagram illustrating a structure of data input through the channel interfaces IF_CH0 to IF_CH15 in the physical area 1142 of the base chip 114 of FIG. 3 in accordance with an embodiment of the present invention. Hereinafter, a case in which each channel has a bandwidth of 64 bits (i.e., 8 bytes) will be described as an example.

Referring to FIG. 4, each of the first to 16th channel interfaces IF_CH0 to IF_CH15 may respectively transmit and receive first and second data words DW0 and DW1 and an address word AW #, wherein # are an integer from 0 to 15. For example, the data word and the address word may be input and output in units of 4 bytes (i.e., 32 bits), respectively. The address word may include a command/address signal.

For example, if the first core chip 112_0 is selected, the memory controller 121 may provide the first and second data words DW0 and DW1 and the address word AW # to each of the first to fourth channel interfaces IF_CH0 to IF_CH3, and the first to fourth channel interfaces IF_CH0 to IF_CH3 may transfer data including first and second data words DW0 and DW1 of 8 bytes (BYTE0 to BYTE7, that is, 64 bits) and the address word AW # to the first to fourth channels CH0 to CH3, respectively. Thus, each of the first to fourth channels CH0 to CH3 may have a 64-bit data bus.

Furthermore, to match line loading and reduce skew of data buses between the left channel interfaces and the right channel interfaces, the arrangement of the PHY bumps PB of the base chip 114 may adopt a mirror structure that is symmetrically arranged with respect to the middle physical area 1142M. Accordingly, the first and second data words DW0 and DW1, which are input and output through the right channel interfaces IF_CH0, IF_CH1, IF_CH4, IF_CH5, IF_CH8, IF_CH9, IF_CH12, and IF_CH13, and the second and first data words DW1 and DW0, which are input and output through the left channel interfaces IF_CH2, IF_CH3, IF_CH6, IF_CH7, IF_CH10, IF_CH11, IF_CH14, and IF_CH15, may be symmetrically respect to the middle physical area 1142M, thereby forming a mirror structure.

Figure 5:
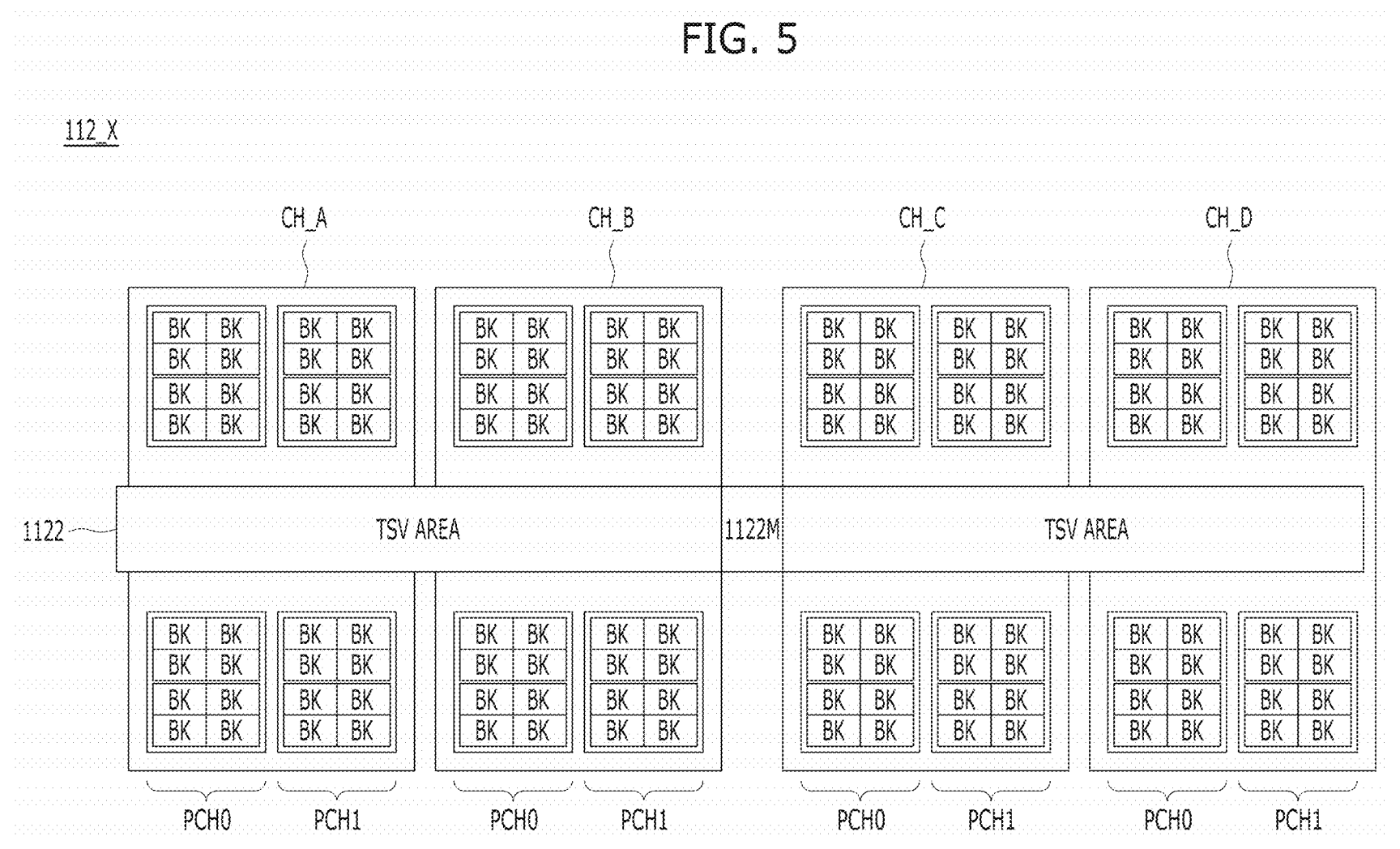

FIG. 5 is a configuration diagram illustrating a core chip 112_x from the core chips 112_0 to 112_3 of FIG. 2 in accordance with an embodiment of the present invention.

Referring to FIG. 5, the core chip 112_x may include first to fourth channels CH_A to CH_D, and each channel includes first and second pseudo-channels PCH0 and PCH1. Each of the first and second pseudo-channels PCH0 and PCH1 may constitute an independent command/address and data interface. Each of the memory banks BK may include memory cells coupled between word lines and bit lines, a row decoder, a column decoder, a sense amplifier, and the like. For example, each of the channels may include 32 memory banks BK, and each of the pseudo-channels may include 16 memory banks BK. According to an embodiment, the memory banks BK included in one channel may be divided into a plurality of bank groups. For example, each of the bank groups may include four memory banks, but the present invention is not limited thereto.

Each of the first to fourth channels CH_A to CH_D may be disposed to be symmetrical with respect to a TSV area 1122. That is, 16 memory banks BK may be disposed on one side of the TSV area 1122, and the remaining 16 memory banks BK may be disposed on the other side of the TSV area 1122. Preferably, the first and second pseudo-channels PCH0 and PCH1 of each of the first to fourth channels CH_A to CH_D may be disposed to be symmetrical around the TSV area 1122, respectively. In addition, in the TSV area 1122, a middle TSV area 1122M may be disposed to interface with the middle TSV area 1144M of the TSV area 1144 of the base chip 114. The left channels and the right channels may be distinguished based on the middle TSV area 1122M of the TSV area 1122. For example, the left channels may include the first and second channels CH_A and CH_B, and the right channels may include the third and fourth channels CH_C and CH_D.

In case of the core chip 112_x, when a bank structure of the left channels and the right channels is adopted as a mirror structure, two cell characteristics may appear in one chip, and thus operation variability may increase and the productivity of memory cells may be deteriorated. Therefore, the core chip 112_x may adopt a shift structure in which the same structure is repeatedly arranged rather than a mirror structure, thereby uniformly maintaining the characteristics of the chip.

Hereinafter, a method of providing an interface between the base chip 114 having channel interfaces of a mirror structure and the core chips 112_x having channel interfaces of a shift structure will be described.

Figure 6:
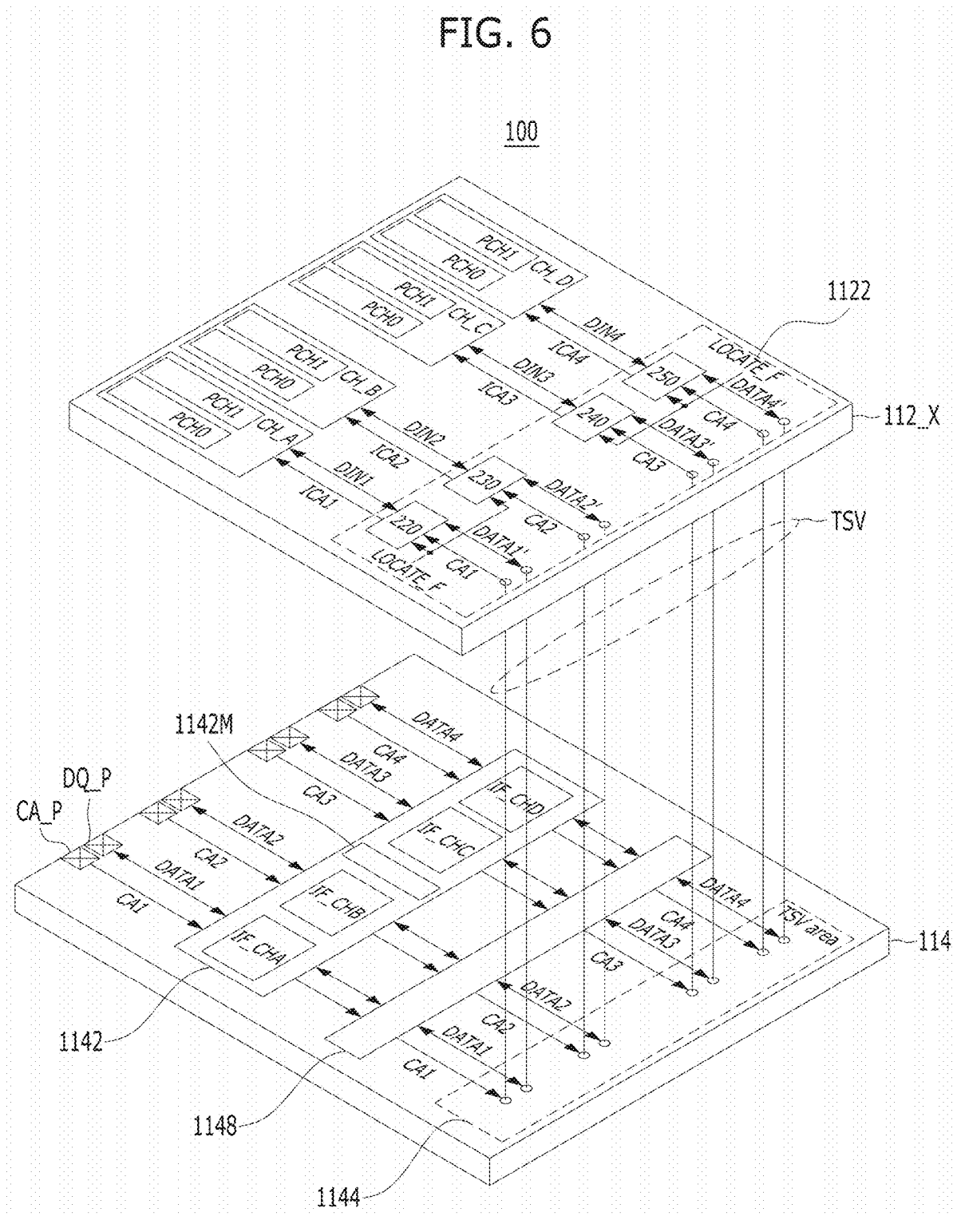
FIG. 6 is a configuration diagram illustrating a stacked memory device in accordance with an embodiment of the present invention.

FIG. 6 is a configuration diagram illustrating a stacked memory device 110 in accordance with an embodiment of the present invention.

Referring to FIG. 6, the stacked memory device 110 may include a base chip 114 and one or more core chips 112_*x*. In FIG. 6, for convenience of description, only one core chip 112_*x* among a plurality of core chips is illustrated. The base chip 114 may be divided into a physical area 1142 and a TSV area 1144. Although not shown in FIG. 6, a direct access area (1146 of FIG. 3) may be additionally disposed on the base chip 114. The base chip 114 may have substantially the same configuration as the base chip 114 described in FIG. 3. The core chip 112_*x* may support first to fourth channels CH_A to CH_D among a plurality of channels, and each channel may include first and second pseudo-channels PCH0 and PCH1. The core chip 112_*x* may have substantially the same configuration as the core chip 112_*x* described in FIG. 5.

The base chip 114 and the core chip 112_*x* may communicate through through-electrodes TSV located in the TSV areas 1122 and 1144. For example, the base chip 114 may transmit first to fourth command/address signals CA1 to CA4 to the core chip 112_*x* through the through-electrodes TSV and transmit and receive first to fourth data DATA1 to DATA4 corresponding to each channel. Though FIG. 6 illustrates that each of the through-electrodes TSV is implemented as one through-electrode TSV, each of the through-electrodes TSV may be implemented in various numbers.

First to fourth channel interfaces IF_CHA to IF_CHD corresponding to the first to fourth channels CH_A to CH_D may be disposed in the physical area 1142. For example, in the physical area 1142, the first to fourth channel interfaces IF_CHA to IF_CHD and a middle physical area 1142M may be disposed, and the first to fourth channel interfaces IF_CHA to IF_CHD may be divided into left channel interfaces IF_CHA and IF_CHB and right channel interfaces IF_CHC and IF_CHD based on the middle physical area 1142M. The first and second channels CH_A and CH_B corresponding to the first and second channel interfaces IF_CHA and IF_CHB may be defined as left channels, and the third and fourth channels CH_C and CH_D corresponding to the third and fourth channel interfaces IF_CHC and IF_CHD may be defined as right channels.

The first to fourth channel interfaces IF_CHA to IF_CHD may receive the first to fourth command/address signals CA1 to CA4 and the first to fourth data DATA1 to DATA4 through a command/address pad CA_P and a data pad DQ_P, respectively. Although not illustrated in FIG. 6, the first to fourth channel interfaces IF_CHA to IF_CHD may receive a clock signal (CK of FIG. 8) through a clock pad. The first to fourth channel interfaces IF_CHA to IF_CHD may transmit the first to fourth data DATA1 to DATA4 transferred from the core chip 112_*x* through the through-electrodes TSV to an external device (e.g., the memory controller 121 of FIG. 1). According to an embodiment, the first to fourth channel interfaces IF_CHA to IF_CHD may transfer the clock signals CK, the first to fourth command/address signals CA1 to CA4, and the first to fourth data DATA1 to DATA4, processed through signal processing, to the core chip 112_*x* through the through-electrodes TSV.

The base chip 114 may further include a repeater 1148 for repeating and transmitting data between the physical area 1142 and the TSV area 1144. In particular, in an embodiment of the present invention, according to the arrangement of the first to fourth channel interfaces IF_CHA to IF_CHD, the repeater 1148 may receive the first data word input in a first order (e.g., descending order) through each channel interface to selectively sort a byte order of the first data word to a second order (e.g., ascending order), and may receive the second data word input in the first order to selectively sort a byte order of the second data word to the second order. For example, in case of the left channel interfaces, the repeater 1148 may output the first and second data words input through each channel interface without changing the byte order. On the other hand, in case of the right channel interfaces, the repeater 1148 may sort the byte order of the first data word input in descending order to the ascending order, and sort the byte order of the second data word input in descending order to the ascending order. A detailed operation of the repeater 1148 will be described in detail with reference to FIG. 16.

The first to fourth command/address signals CA1 to CA4 and the first to fourth data DATA1 to DATA4 may be input and output in the data structure described in FIG. 4. That is, each of the first to fourth command/address signals CA1 to CA4 may include address words (AW # of FIG. 4), and each of the first to fourth data DATA1 to DATA4 may include first and second data words (DW0 and DW1 of FIG. 4). For example, the data word and the address word may be input and output in units of 4 bytes (i.e., 32 bits), respectively. Data input and output through the left channel interfaces IF_CHA and IF_CHB and data input and output through the right channel interfaces IF_CHC and IF_CHD may have a mirror structure symmetrical to each other with respect to the middle physical area 1142M.

Figure 7:
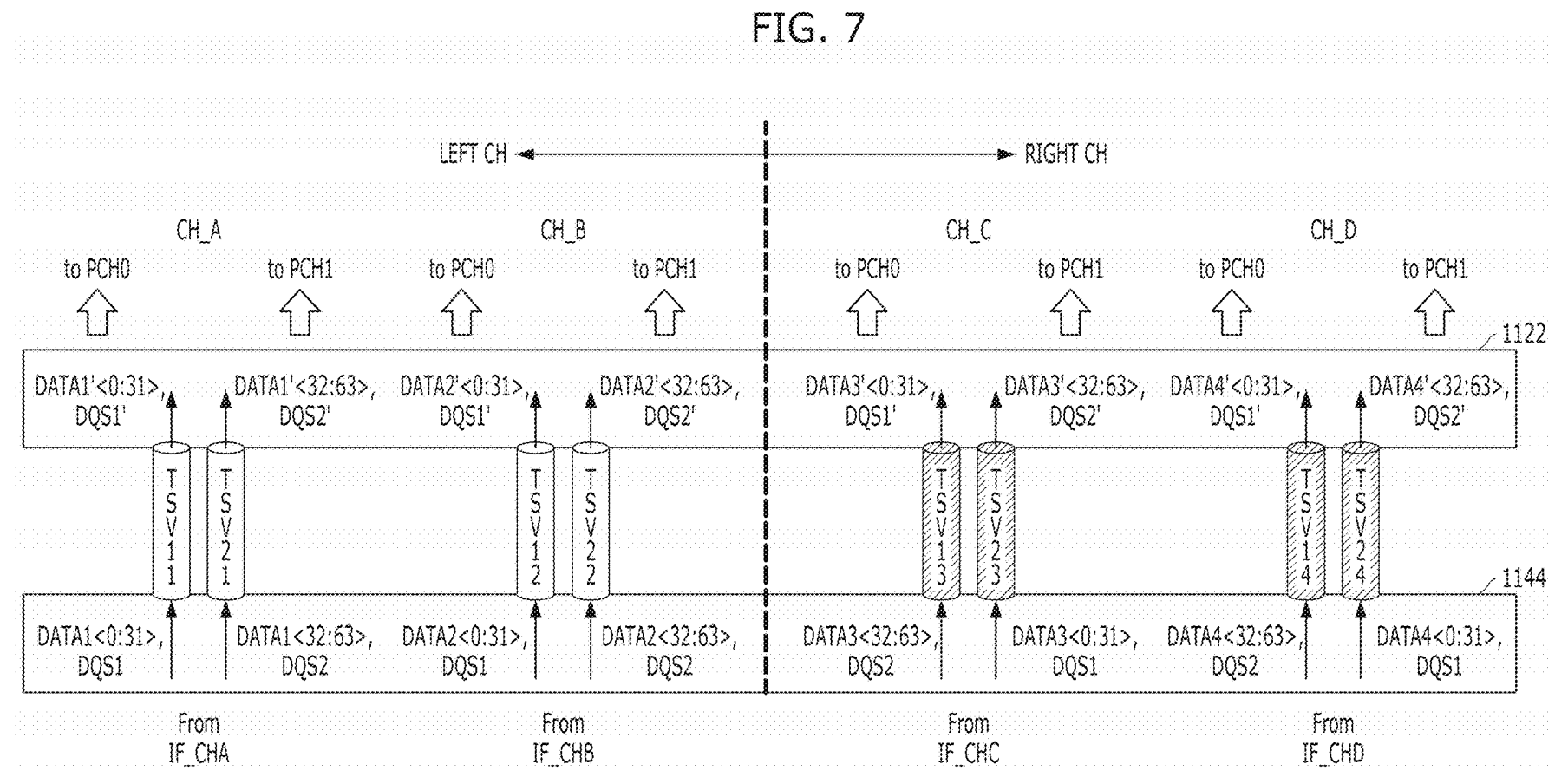

In FIG. 7, according to an embodiment of this invention, through-electrodes TSV for transferring the first data word DW0 and the second data word DW1 of each of the first to fourth data DATA1 to DATA4 between the base chip 114 and the core chip 112_*x* are illustrated. For reference, the first data word DW0 (e.g., DATA1<0:31>, DATA2<0:31>, DATA3<0:31> and DATA4<0:31>) may be transmitted in synchronization with a first strobe signal DQS1, and the second data word DW2 (e.g., DATA1<32:63>, DATA2<32:63>, DATA3<32:63> and DATA4<32:63>) may be transmitted in synchronization with a second strobe signal DQS2. For convenience of description, FIG. 7 illustrates a case in which data is transferred from the base chip 114 to the core chip 112_*x* during a write operation.

Referring to FIG. 7, the first to fourth data DATA1 to DATA4 may be input and output in a mirror structure through the first to fourth channel interfaces IF_CHA to IF_CHD. That is, the first and second data words of the first and second data DATA1 and DATA2 may be symmetrically output and output to the first and second data words of the third and fourth data DATA3 and DATA4.

The through-electrodes TSV can include first through-electrodes TSV11 to TSV14 and second through-electrodes TSV21 to TSV24. In an embodiment of the present invention, since the first to fourth data DATA1 to DATA4 are input and output in a mirror structure through the first to fourth channel interfaces IF_CHA to IF_CHD, the first data words DATA1<0:31> and DATA2<0:31> from the left channel interface may be transferred to the first through-electrodes TSV11 and TSV12, and the second data words DATA1<32:63> and DATA2<32:63> from the left channel interface may be transferred to the second through-electrodes TSV21 and TSV22. On the other hand, the second data words DATA3<32:63> and DATA4<32:63> from the right channel interface may be transferred to the first through-electrodes TSV13 and TSV14, and the first data words DATA3<0:31> and DATA4<0:31> from the right channel interface may be transferred to the second through-electrodes TSV23 and TSV24.

For example, the first data word DATA1<0:31> of the first data DATA1 may be transferred as first core data word DATA1'<0:31> of first core data DATA1', through the first through-electrode TSV11 from the first channel interface IF_CHA to the TSV area 1122 of the core chip 112_x. The second data word DATA1<32:63> of the first data DATA1 may be transferred as second core data word DATA1'<32:63> of the first core data DATA1', through the second through-electrode TSV21 from the first channel interface IF_CHA to the TSV area 1122 of the core chip 112_x. The first data word DATA2<0:31> of the second data DATA2 may be transferred as first core data word DATA2'<0:31> of second core data DATA2', through the first through-electrode TSV12 from the second channel interface IF_CHB to the TSV area 1122 of the core chip 112_x. The second data word DATA2<32:63> of the second data DATA2 may be transferred as second core data word DATA2'<32:63> of the second core data DATA2', through the second through-electrode TSV22 from the second channel interface IF_CHB to the TSV area 1122 of the core chip 112_x. For reference, the first core data words DATA1'<0:31> and DATA2'<0:31> may be transmitted in synchronization with a first strobe signal DQS1', and the second data words DATA1'<32:63> and DATA2'<32:63> may be transmitted in synchronization with a second strobe signal DQS2'.

On the contrary, the second data word DATA3<32:63> of the third data DATA3 may be transferred as first core data word DATA3'<0:31> of third core data DATA3', through the first through-electrode TSV13 from the third channel interface IF_CHC to the TSV area 1122 of the core chip 112_x. The first data word DATA3<0:31> of the third data DATA3 may be transferred as second core data word DATA3'<32:63> of the third core data DATA3', through the second through-electrode TSV23 from the third channel interface IF_CHC to the TSV area 1122 of the core chip 112_x. The second data word DATA4<32:63> of the fourth data DATA4 may be transferred as first core data word DATA4'<0:31> of fourth core data DATA4', through the first through-electrode TSV14 from the fourth channel interface IF_CHD to the TSV area 1122 of the core chip 112_x. The first data word DATA4<0:31> of the fourth data DATA4 may be transferred as second core data word DATA4'<32:63> of the fourth core data DATA4', through the second through-electrode TSV24 from the fourth channel interface IF_CHD to the TSV area 1122 of the core chip 112_x. For reference, the first core data words DATA3'<0:31> and DATA4'<0:31> may be transmitted in synchronization with the first strobe signal DQS1', and the second data words DATA3'<32:63> and DATA4'<32:63> may be transmitted in synchronization with the second strobe signal DQS2'.

Accordingly, the first data words DATA1<0:31> and DATA2<0:31> and the second data words DATA1<32:63> and DATA2<32:63> may be transferred from the left channel interface to the first pseudo-channel PCH0 and the second pseudo-channel PCH1, respectively. On the other hand, the first data words DATA3<0:31> and DATA4<0:31> and the second data words DATA3<32:63> and DATA4<32:63> may be transferred from the right channel interface to the second pseudo-channel PCH1 and the first pseudo-channel PCH0, respectively. As a result, the first to fourth data DATA1 to DATA4 input with the mirror structure may be selectively swapped and transferred to the core chip 112_x as the first to fourth core data DATA1' to DATA4' of the shift structure.

Referring back to FIG. 6, the core chip 112_x may include first to fourth transfer control circuits 220 to 250 disposed between the through-electrodes TSV of the TSV area 1122 and the first to fourth channels CH_A to CH_D, respectively. The first to fourth transfer control circuits 220 to 250 may receive the first to fourth command/address signals CA1 to CA4 and the first to fourth core data DATA1' to DATA4', respectively. Each of the first to fourth transfer control circuits 220 to 250 may generate a channel designation signal (PC_ASS of FIG. 8) for designating the first and second pseudo-channels PCH0 and PCH1 according to a corresponding command/address signal of the first to fourth command/address signals CA1 to CA4, and output channel commands (PC0_CMD and PC1_CMD of FIG. 8) according to the channel designation signal PC_ASS and location information signal LOCATE_F indicating a location of a corresponding channel. For reference, the location information signal LOCATE_F may be a signal having position information of the first to fourth channel interfaces IF_CHA to IF_CHD corresponding to the first to fourth channels CH_A to CH_D, and may be provided to have a logic level fixed to the left and right channels, respectively. The first to fourth transfer control circuits 220 to 250 may transmit and receive the first and second core data words between the corresponding channel and the base chip 114 according to the channel commands PC0_CMD and PC1_CMD, respectively.

In more detail, each of the first to fourth transfer control circuits 220 to 250 may generate a first channel command PC0_CMD and a second channel command PC1_CMD according to the corresponding command/address signal, and may selectively swap the first channel command PC0_CMD and the second channel command PC1_CMD according to an arrangement of the corresponding channel interface. For example, the third and fourth transfer control circuits 240 and 250 corresponding to the right channel interface may swap the first channel command PC0_CMD and the second channel command PC1_CMD. Each of the first to fourth transfer control circuits 220 to 250 may control the first pseudo-channel PCH0 of the corresponding channel to transmit and receive the first core data word according to the first channel command PC0_CMD, and may control the second pseudo-channel PCH1 to transmit and receive the second core data word according to the second channel command PC1_CMD. For reference, each of the first to fourth transfer control circuits 220 to 250 may receive the dedicated location information signal LOCATE_F, which are determined depending on the arrangement of the corresponding channel interface. Preferably, the first to fourth transfer control circuits 220 to 250 may be disposed in the TSV area 1122 or a region close to the TSV area 1122.

For example, during a write operation, the first transfer control circuit 220 may transmit the first core data word DATA1'<0:31> and the second core data word DATA1'<32:63> from the through-electrodes TSV to respective banks (i.e., a memory cell array) of the first pseudo-channel PCH0 and the second pseudo-channel PCH1 of the first channel CHA, respectively. Thus, the memory cell array of the first pseudo-channel PCH0 and the second pseudo-channel PCH1 may store the first core data DATA1'. In addition, during a read operation, the first transfer control circuit 220 may transmit the first core data word DATA1'<0:31> and the second core data word DATA1'<32:63> to the through-electrodes TSV from the memory cell array of the first pseudo-channel PCH0 and the second pseudo-channel PCH1 of the first channel CH_A, respectively.

Hereinafter, since the first to fourth transfer control circuits 220 to 250 have substantially the same configuration, the first transfer control circuit 220 will be described as an example.

Figures 8, 9:
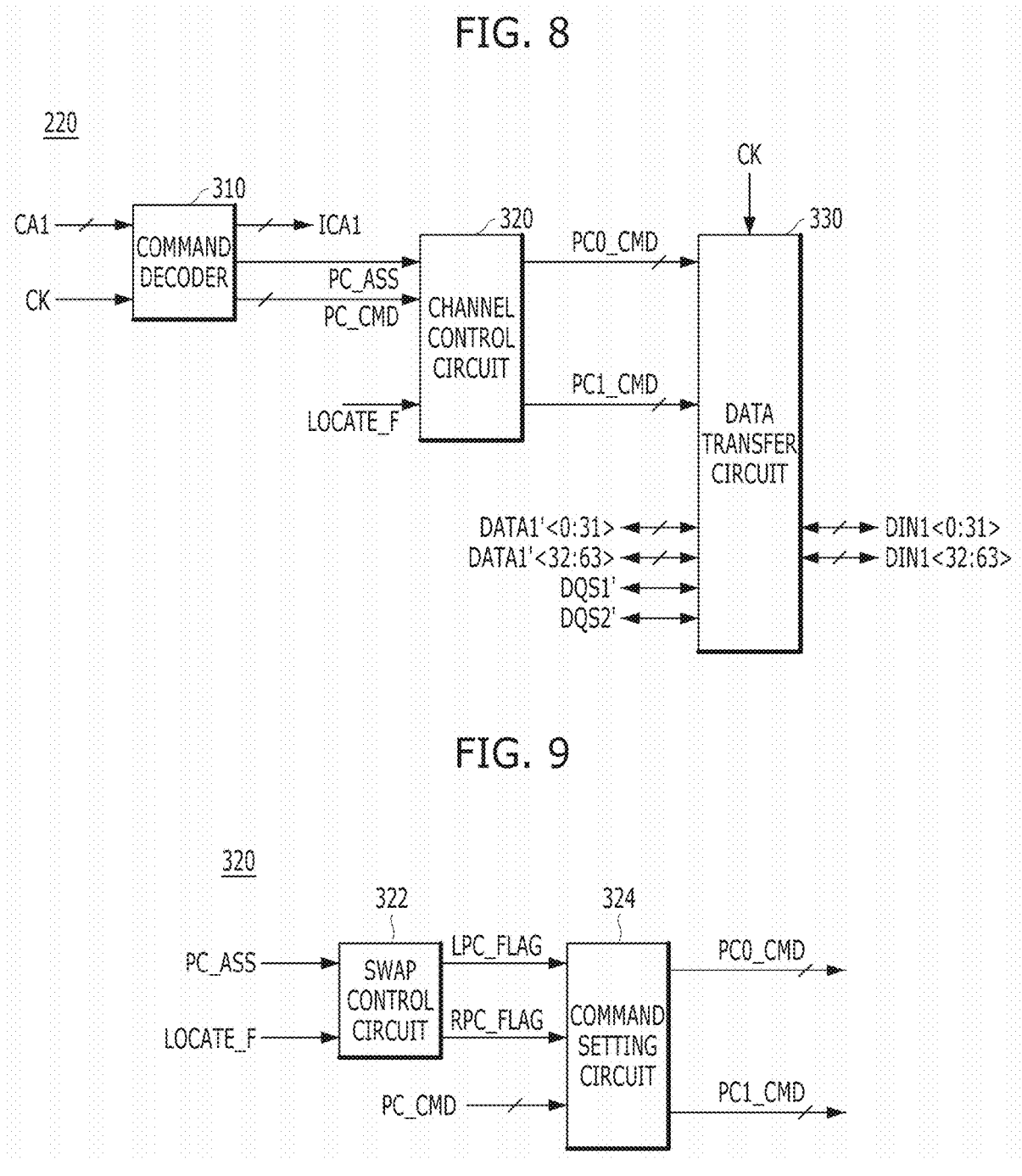
FIG. 8 is a detailed block diagram illustrating a first transfer control circuit of FIG. 6 in accordance with an embodiment of the present invention.
FIG. 9 is a detailed block diagram illustrating a channel control circuit of FIG. 8 in accordance with an embodiment of the present invention.

FIG. 8 is a detailed block diagram illustrating the first transfer control circuit 220 of FIG. 6.

Referring to FIG. 8, the first transfer control circuit 220 may include a command decoder 310, a channel control circuit 320, and a data transfer circuit 330.

The command decoder 310 may decode the first command/address signal CA1 according to the clock signal CK to generate an internal command/address signal ICA, the channel designation signal PC_ASS, and a channel seed command PC_CMD. The internal command/address signal ICA may include addresses such as a bank address, a row address, and a column address, and a command. The channel designation signal PC_ASS may be a signal for designating the first and second pseudo-channels PCH0 and PCH1, and the command decoder 310 may generate the channel designation signal PC_ASS of a logic low level when the first command/address signal CA1 corresponding to the first pseudo-channel PCH0 is input, and generate the channel designation signal PC_ASS of a logic high level when the first command/address signal CA1 corresponding to the second pseudo-channel PCH1 is input. The channel seed command PC_CMD is a command for designating an operation to be performed in the banks of each channel, and may include, for example, a read command, a write command, and the like.

The channel control circuit 320 may output the channel seed command PC_CMD as one of the first channel command PC0_CMD and the second channel command PC1_CMD according to the channel designation signal PC_ASS and the location information signal LOCATE_F. In particular, the channel control circuit 320 may output the channel seed command PC_CMD as one of the first channel command PC0_CMD and the second channel command PC1_CMD according to the channel designation signal PC_ASS while swapping the first channel command PC0_CMD and the second channel command PC1_CMD according to the location information signal LOCATE_F. The location information signal LOCATE_F may be a signal for position information of the first to fourth channel interfaces IF_CHA to IF_CHD corresponding to the first to fourth channels CH_A to CH_D. For example, the first and second transfer control circuits 220 and 230 corresponding to the first and second channels CH_A and CH_B of the left channel interface may be provided with the location information signal LOCATE_F of a logic high level, and the third and fourth transfer control circuits 240 and 250 corresponding to the third and fourth channels CH_C and CH_D of the right channel interface may be provided with the location information signal LOCATE_F of a logic low level. In an embodiment of the present invention, it is described that the channel control circuit 320 receives the location information signal LOCATE_F having a fixed logic level, but the present invention is not limited thereto. According to an embodiment, the command decoder 310 may decode the first command/address signal CA1 to provide the location information signal LOCATE_F to the channel control circuit 320.

The data transfer circuit 330 may transfer the first core data word DATA1'<0:31> and the second core data word DATA1'<32:63> of the first core data DATA1 from the through-electrodes TSV to the first pseudo-channel PCH0 and the second pseudo-channel PCH1, respectively. The data transfer circuit 330 may transfer first internal data word DIN1<0:31> and second internal data word DIN1<32:63> of internal data DIN1 to the through-electrodes TSV from the first pseudo-channel PCH0 and the second pseudo-channel PCH1, respectively. The data transfer circuit 330 may align the first core data word DATA1'<0:31> in synchronization with the first strobe signal DQS1' transmitted through the through-electrodes TSV, and may align the second core data word DATA1'<32:63> in synchronization with the second strobe signal DQS2' transmitted through the through-electrodes TSV. The data transfer circuit 330 may transmit and receive the first core data word DATA1'<0:31> to/from the memory banks BK through the first pseudo-channel PCH0 in response to the first channel command PC0_CMD, and transmit and receive the second core data word DATA1'<32:63> to/from the memory banks BK through the second pseudo-channel PCH1 in response to the second channel command PC1_CMD.

FIG. 9 is a detailed block diagram illustrating the channel control circuit 320 of FIG. 8 in accordance with an embodiment of the present disclosure.

Referring to FIG. 9, the channel control circuit 320 may include a swap control circuit 322 and a command setting circuit 324.

The swap control circuit 322 may transmit the channel designation signal PC_ASS as one of a first swap control signal RPC_FLAG and a second swap control signal LPC_FLAG according to the location information signal LOCATE_F. When the location information signal LOCATE_F becomes a first logic level (for example, a logic high level), the swap control circuit 322 may output the channel designation signal PC_ASS as the first swap control signal RPC_FLAG, and invert and output the channel designation signal PC_ASS as the second swap control signal LPC_FLAG. When the location information signal LOCATE_F becomes a second logic level (for example, a logic low level), the swap control circuit 322 may output the channel designation signal PC_ASS as the second swap control signal LPC_FLAG, and invert and output the channel designation signal PC_ASS as the first swap control signal R_FLAG.

The command setting circuit 324 may set the channel seed command PC_CMD to the first channel command PC0_CMD or the second channel command PC1_CMD according to the first swap control signal RPC_FLAG and the second swap control signal LPC_FLAG.

Figure 10:
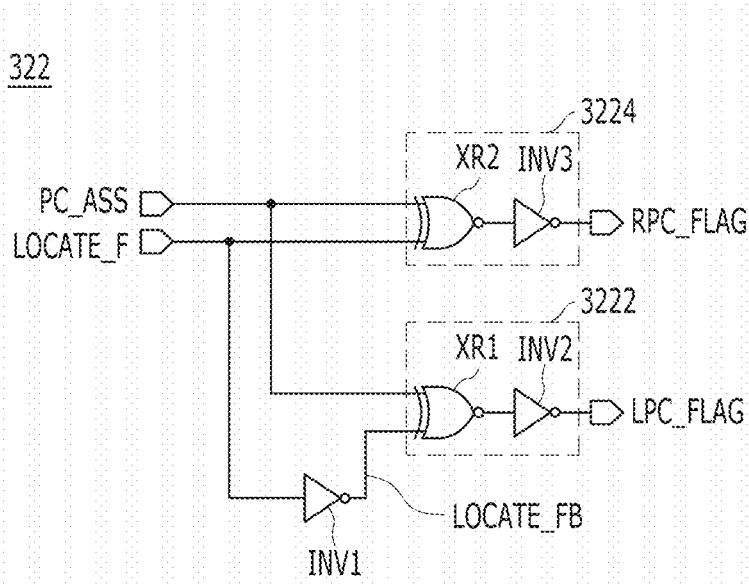
FIG. 10 is a circuit diagram illustrating a swap control circuit of FIG. 9 in accordance with an embodiment of the present invention.

FIG. 10 is a circuit diagram illustrating the swap control circuit 322 of FIG. 9 in accordance with an embodiment of the present disclosure.

Referring to FIG. 10, the swap control circuit 322 may include a first inverter INV1, and first and second swap circuits 3222 and 3224.

The first inverter INV1 may output an inverted location information signal LOCATE_FB by inverting the location information signal LOCATE_F.

The first swap circuit 3222 may perform a logic exclusive NOR (XNOR) operation on the location information signal LOCATE_F and the channel designation signal PC_ASS to output the first swap control signal RPC_FLAG. The first swap circuit 3222 may include a first exclusive OR (XOR) gate XR1 and a second inverter INV2. The first swap circuit 3222 may output the first swap control signal RPC_FLAG of a logic high level when the location information signal LOCATE_F and the channel designation signal PC_ASS have the same logic level, and output the first swap control signal RPC_FLAG of a logic low level when the location information signal LOCATE_F and the channel designation signal PC_ASS have the different logic levels. As a result, the first swap circuit 3222 may output the channel designation signal PC_ASS as the first swap control signal RPC_FLAG when the location information signal LOCATE_F is a logic high level, and may invert and output the channel designation signal PC_ASS_F as the first swap control signal RPC_FLAG when the location information signal LOCATE_F is a logic low level.

The second swap circuit 3224 may perform a logic XNOR operation on the inverted location information signal LOCATE_FB and the channel designation signal PC_ASS to output the second swap control signal LPC_FLAG. The first swap circuit 3222 may include a second XOR gate XR2 and a third inverter INV3. The second swap circuit 3224 may output the second swap control signal LPC_FLAG having a logic high level when the inverted location information signal LOCATE_FB and the channel designation signal PC_ASS have the same logic level, and output the second swap control signal LPC_FLAG having a logic low level when the inverted location information signal LOCATE_FB and the channel designation signal PC_ASS have the different logic levels. As a result, the second swap circuit 3224 may invert and output the channel designation signal PC_ASS as the second swap control signal LPC_FLAG when the location information signal LOCATE_F is a logic high level, and may output the channel designation signal PC_ASS_F as the second swap control signal LPC_FLAG when the location information signal LOCATE_F is a logic low level.

Figure 11:
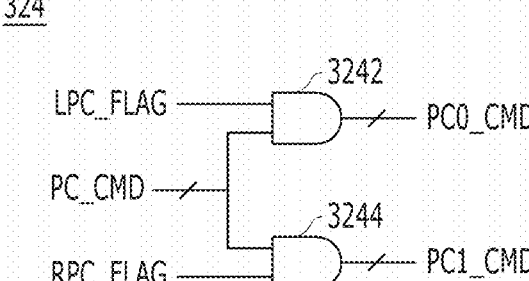
FIG. 11 is a circuit diagram illustrating a command setting circuit of FIG. 9 in accordance with an embodiment of the present invention.

FIG. 11 is a circuit diagram illustrating the command setting circuit 324 of FIG. 9 in accordance with an embodiment of the present disclosure.

Referring to FIG. 11, the command setting circuit 324 may include a first setting circuit 3242 and a second setting circuit 3244.

When the second swap control signal LPC_FLAG is enabled, the first setting circuit 3242 may output the channel seed command PC_CMD as the first channel command PC0_CMD. Preferably, the first setting circuit 3242 may be implemented with an AND gate for performing a logic AND operation on the second swap control signal LPC_FLAG and the channel seed command PC_CMD. When the first swap control signal RPC_FLAG is enabled, the second setting circuit 3244 may output the channel seed command PC_CMD as the second channel command PC1_CMD. Preferably, the second setting circuit 3244 may be implemented with an AND gate for performing a logic AND operation on the first swap control signal RPC_FLAG and the channel seed command PC_CMD.

Hereinafter, an operation of the channel control circuit 320 will be described with reference to FIGS. 9 to 12.

Figure 12:
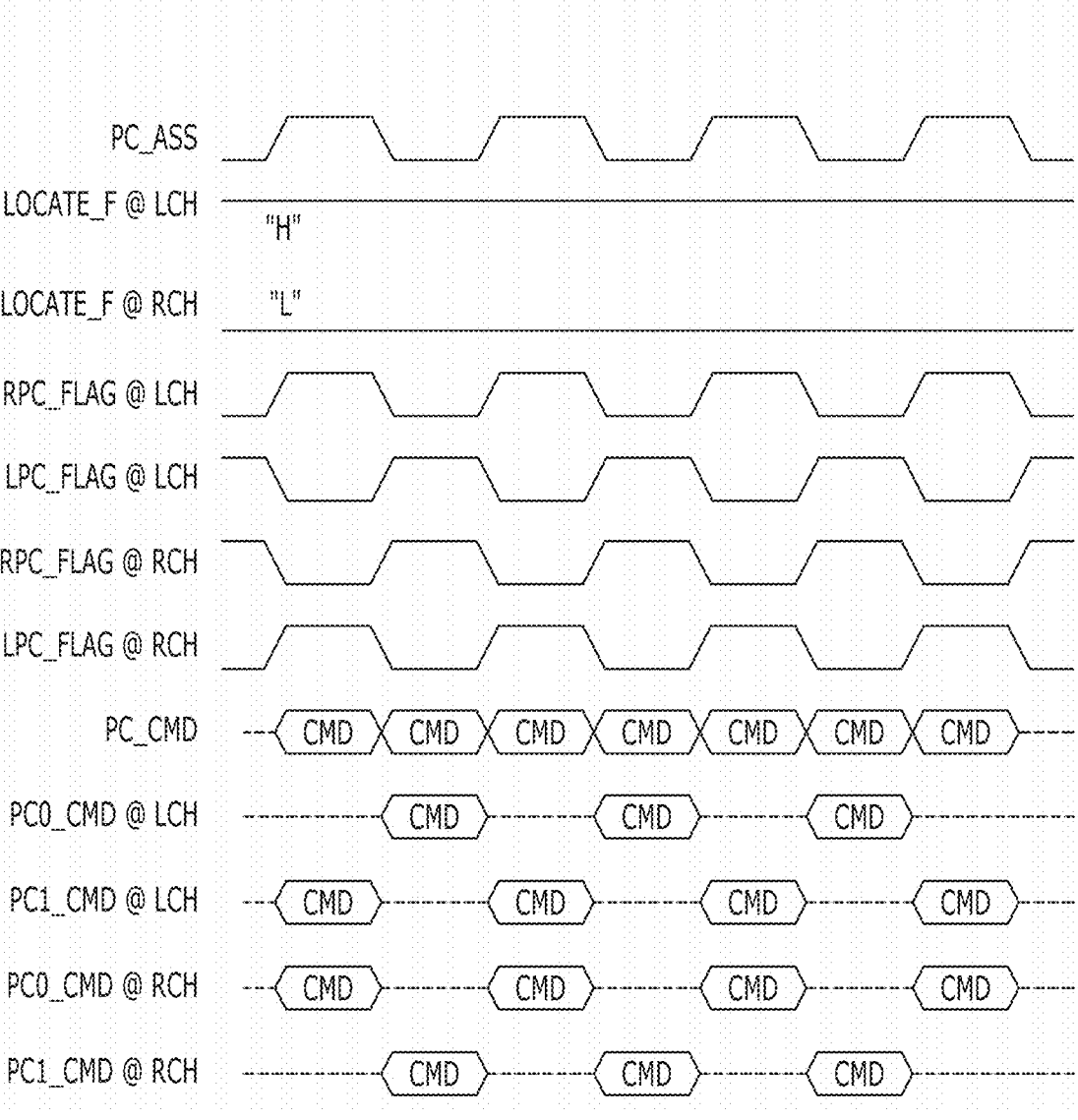
FIG. 12 is a waveform diagram for describing an operation of the channel control circuit of FIG. 9 in accordance with an embodiment of the present invention.

FIG. 12 is a waveform diagram for describing an operation of the channel control circuit 320 of FIG. 9 in accordance with an embodiment of the present disclosure.

Referring to FIG. 12, it is illustrated that the channel designation signal PC_ASS for designating the first and second pseudo-channels PCH0 and PCH1 is toggled between a logic high level and a logic low level, to thereby alternately designate the second pseudo-channel PCH1 and the first pseudo-channel PCH0.

The first and second transfer control circuits 220 and 230 corresponding to the left channel may be provided with the location information signal LOCATE_F @ LCH having a logic high level. According to the location information signal LOCATE_F @ LCH having the logic high level, the swap control circuit 322 may output the channel designation signal PC_ASS as the first swap control signal RPC_FLAG @LCH while inverting and outputting the channel designation signal PC_ASS as the second swap control signal LPC_FLAG @ LCH. The command setting circuit 324 may output the channel seed command PC_CMD as the second channel command PC1_CMD @ LCH when the first swap control signal RPC_FLAG @ LCH is enabled, and output the channel seed command PC_CMD as the first channel command PC0_CMD @ LCH when the second swap control signal LPC_FLAG @ LCH is enabled.

On the contrary, the third and fourth transfer control circuits 240 and 250 corresponding to the right channel may be provided with the location information signal LOCATE_F @ RCH having a logic low level. According to the location information signal LOCATE_F @ RCH having the logic low level, the swap control circuit 322 may output the channel designation signal PC_ASS as the second swap control signal LPC_FLAG @ RCH while inverting and outputting the channel designation signal PC_ASS as the first swap control signal RPC_FLAG @ RCH. The command setting circuit 324 may output the channel seed command PC_CMD as the first channel command PC0_CMD @ RCH when the second swap control signal LPC_FLAG @ RCH is enabled, and output the channel seed command PC_CMD as the first channel command PC1_CMD @ RCH when the first swap control signal RPC_FLAG @ RCH is activated.

As described above, in the embodiment of the present invention, the channel control circuit 320 may output the channel seed command PC_CMD to one of the first channel command PC0_CMD and the second channel command PC1_CMD according to the arrangement of the channel interfaces corresponding to the channels. Accordingly, each of the transfer control circuits 220 to 250 may control the first pseudo-channel PCH0 of the corresponding channel to transmit and receive the first data word, and the second pseudo-channel PCH1 to transmit and receive the second data word.

Figure 13:
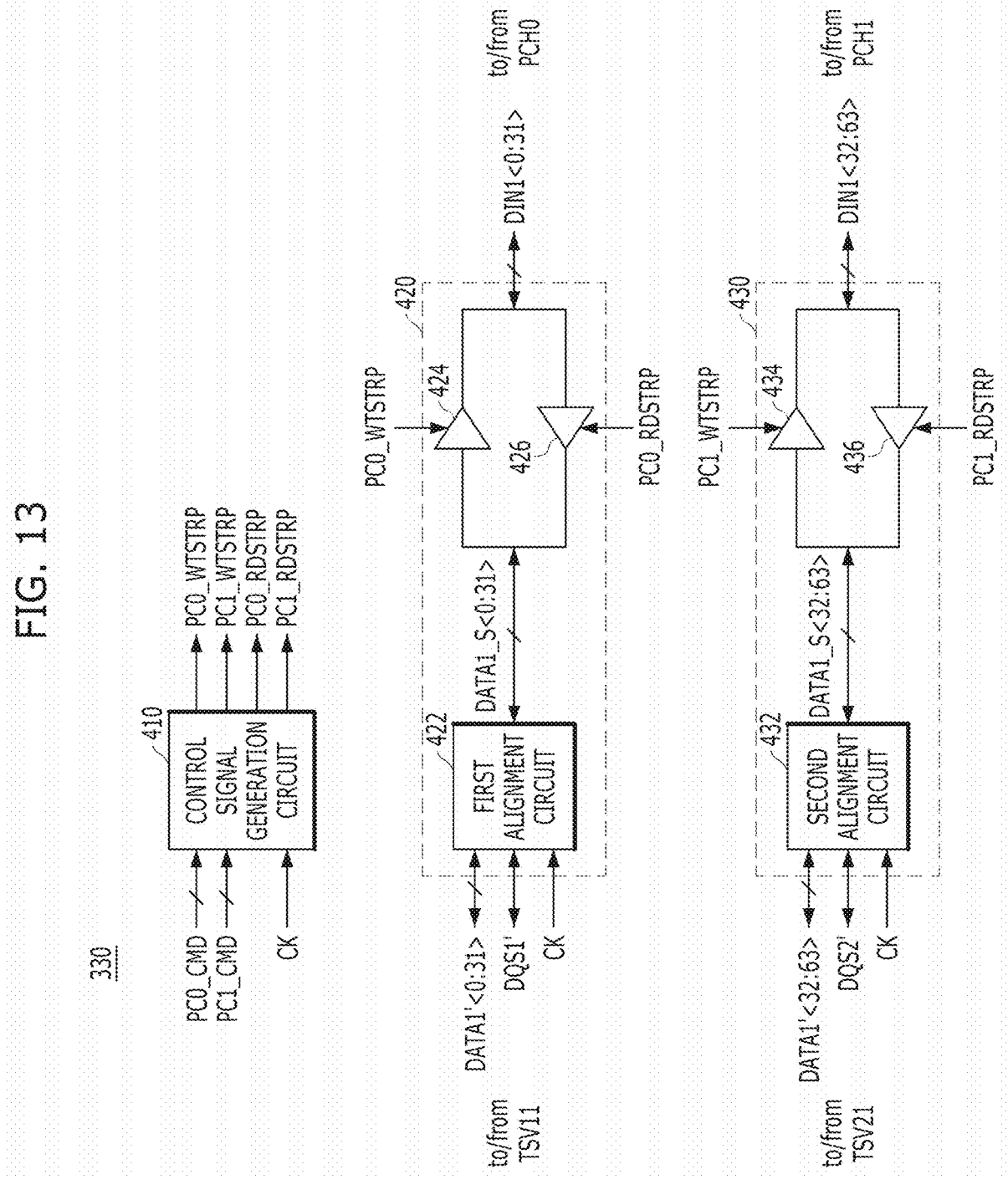
FIG. 13 is a detailed configuration diagram illustrating a data transfer circuit of FIG. 8 in accordance with an embodiment of the present invention.

FIG. 13 is a detailed configuration diagram illustrating the data transfer circuit 330 of FIG. 8 in accordance with an embodiment of the present disclosure.

Referring to FIG. 13, the data transfer circuit 330 may include a control signal generation circuit 410, a first data input/output (I/O) circuit 420, and a second data I/O circuit 430.

The control signal generation circuit 410 may generate first and second write control signals PC0_WTSTRP and PC1_WTSTRP, and first and second read control signals PC0_RDSTRP and PC1_RDSTRP, respectively corresponding to the first channel command PC0_CMD and the second channel command PC1_CMD, according to the clock signal CK. When the first channel command PC0_CMD is input, the control signal generation circuit 410 may generate the first write control signal PC0_WTSTRP and the first read control signal PC0_RDSTRP after a predetermined delay. When the second channel command PC1_CMD is input, the control signal generation circuit 410 may generate the second write control signal PC1_WTSTRP and the second read control signal PC1_RDSTRP after a predetermined delay.

The first data I/O circuit 420 may transmit the first core data word DATA1'<0:31> as the first internal data word DIN1<0:31> according to the first strobe signal DQS1' and the first write control signal PC0_WTSTRP. The first data I/O circuit 420 may transmit the first internal data word DIN1<0:31> as the first core data word DATA1'<0:31> according to the first read control signal PC0_RDSTRP.

In detail, the first data I/O circuit 420 may include a first alignment circuit 422, a first receiver 424, and a first transmitter 426. During a write operation, the first alignment circuit 422 may align the first core data word DATA1'<0:31> according to the first strobe signal DQS1', and output aligned first data word DATA1_S<0:31>. During a read operation, the first alignment circuit 422 may generate the first strobe signal DQS1' based on the clock signal CK, and output the aligned first data word DATA1_S<0:31> together with the first strobe signal DQS1' as the first core data word DATA1'<0:31>. The first receiver 424 may receive the aligned first data word DATA1_S<0:31> according to the first write control signal PC0_WTSTRP to output the first internal data word DIN1<0:31>. The first transmitter 426 may transfer the first internal data word DIN1<0:31> as the aligned first data word DATA1_S<0:31> according to the first read control signal PC0_RDSTRP.

The second data I/O circuit 430 may transmit the second core data word DATA1'<32:63> as the second internal data word DIN1<32:63> according to the second strobe signal DQS2' and the second write control signal PC1_WTSTRP. The second data I/O circuit 430 may transmit the second internal data word DIN1<32:63> as the second core data word DATA1'<32:63> according to the second read control signal PC1_RDSTRP.

In detail, the second data I/O circuit 430 may include a second alignment circuit 432, a second receiver 434, and a second transmitter 436. During a write operation, the second alignment circuit 432 may align the second core data word DATA1'<32:63> according to the second strobe signal DQS2', and output aligned second data word DATA1_S<32:63>. During a read operation, the second alignment circuit 432 may generate the second strobe signal DQS2' based on the clock signal CK, and output the aligned second data word DATA1_S<32:63> together with the second strobe signal DQS2' as the second core data word DATA1'<32:63>. The second receiver 434 may receive the aligned second data word DATA1_S<32:63> according to the second write control signal PC1_WTSTRP to output the second internal data word DIN1<32:63>. The second transmitter 436 may transfer the second internal data word DIN1<32:63> as the aligned second data word DATA1_S<32:63> according to the second read control signal PC1_RDSTRP.

Hereinafter, a data transfer operation according to an embodiment of the present invention will be described with reference to FIGS. 6 to 16.

Figure 14:
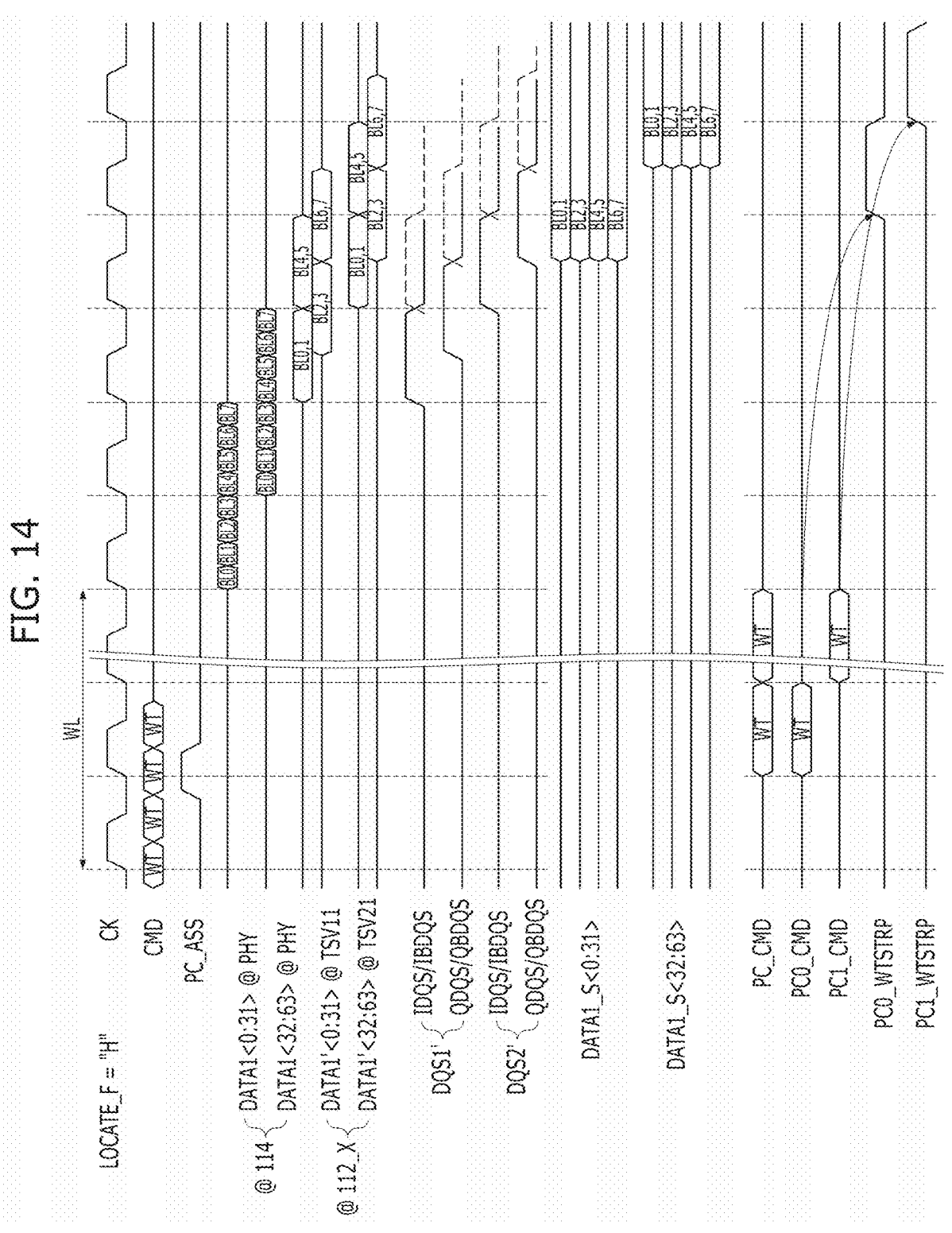
FIGS. 14 and 15 are waveform diagrams for describing a data transfer operation of a stacked memory device in accordance with an embodiment of the present invention.
Figure 15:
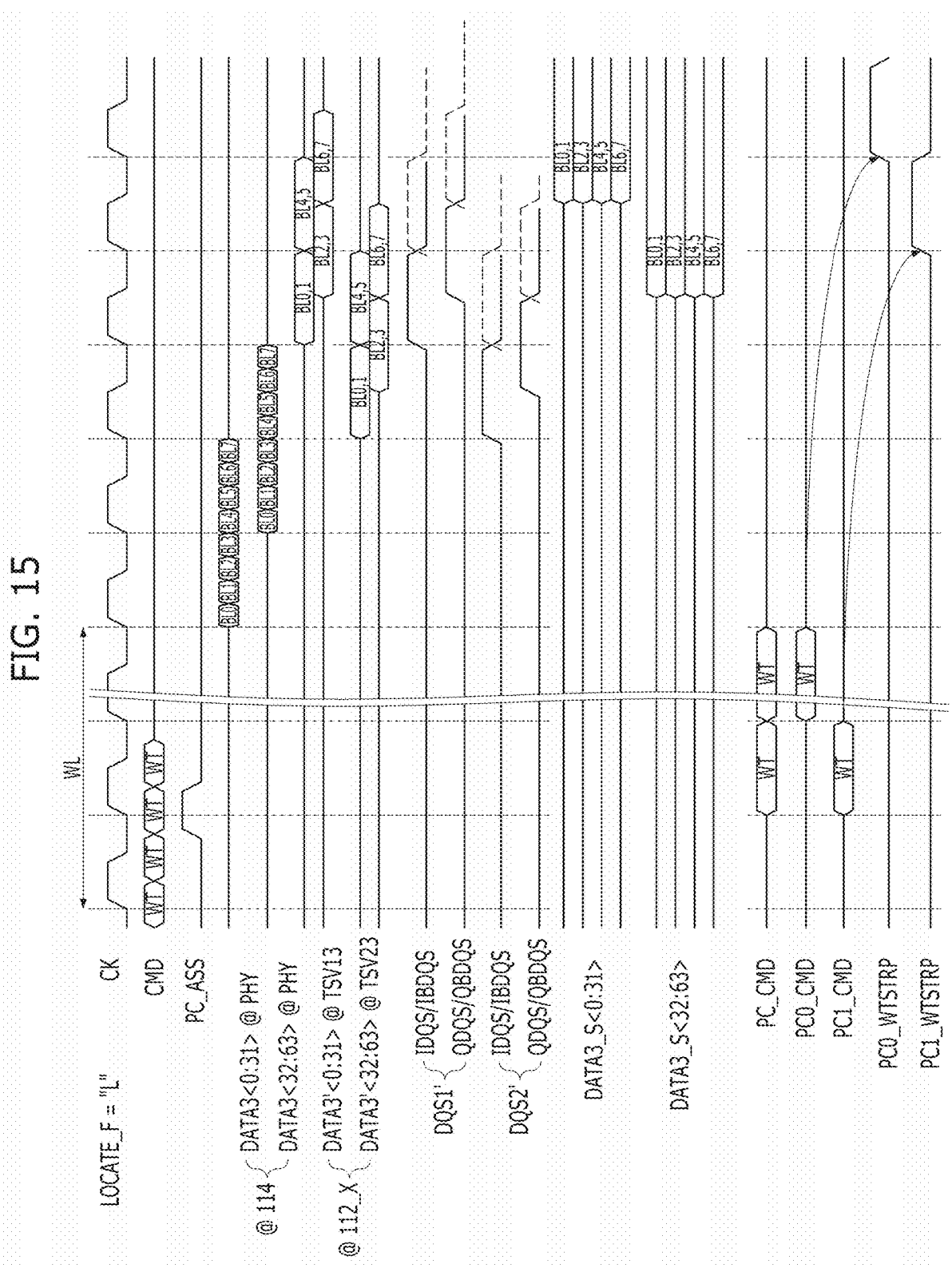

FIGS. 14 and 15 are waveform diagrams for describing a data transfer operation of a stacked memory device 110 in accordance with an embodiment of the present invention.

Referring to FIGS. 14 and 15, during a write operation, the first to fourth command/address signals CA1 to CA4 may be input to the first to fourth channel interfaces IF_CHA to IF_CHD of the base chip 114, respectively. A command (i.e., a write command WT) indicating a write operation per channel may be continuously input four times at a rising edge and a falling edge of the clock CK. In this case, since the channel designation signal PC_ASS is input to a logic high level together with the third write command WT, the first and second input write commands WT may correspond to the first pseudo-channel PCH0, and the third and fourth input write commands WT may correspond to the second pseudo-channel PCH1. After a write latency WL from an input time point of the write command WT, the first to fourth data DATA1 to DATA1 of a burst length 8 (BL8) may be input to 32 data pads DQ_P in response to a rising edge and a falling edge of a data clock (not shown).

Referring to FIG. 14, the first data word DATA1<0:31> and the second data word DATA1<32:63> of the first data DATA1 may be input to the first channel interface IF_CHA corresponding to the left interface, and respectively transferred as the first core data word DATA1'<0:31> and the second core data word DATA1'<32:63> to the TSV area 1122 of the core chip 112_x through the first through-electrode TSV11 and the second through-electrode TSV21.

The command decoder 310 of the first transfer control circuit 220 may decode the first command/address signal CA1 to generate the internal command/address signal ICA, the channel designation signal PC_ASS, and the channel seed command PC_CMD. The channel control circuit 320 of the first transfer control circuit 220 may sequentially output the channel seed command PC_CMD as the first channel command PC0_CMD and the second channel command PC1_CMD, according to the channel designation signal PC_ASS and the location information signal LOCATE_F of a logic high level.

The data transfer circuit 330 of the first transfer control circuit 220 may sequentially generate the first write control signal PC0_WTSTRP corresponding to the first channel command PC0_CMD and the second write control signal PC1_WTSTRP corresponding to the second channel command PC1_CMD. The data transmission circuit 330 may output the aligned first data word DATA1_S<0:31> by aligning the first core data word DATA1'<0:31> according to 4-phase signals IDQS, IBDQS, QDQS, and QBDQS, which are generated by the first strobe signal DQS1'. Then, the data transmission circuit 330 may output the aligned second data word DATA1_S<32:63> by aligning the second core data word DATA1'<32:63> according to 4-phase signals IDQS, IBDQS, QDQS, and QBDQS, which are generated by the second strobe signal DQS2'. Finally, the data transmission circuit 330 may transmit the aligned first data word DATA1_S<0:31> as the first internal data word DIN1<0:31>> in response to the first write control signal PC0_WTSTRP, and transmit the aligned second data word DATA1_S<32:63> as the second internal data word DIN1<32:63> in response to the second write control signal PC1_WTSTRP.

Referring to FIG. 15, the first data word DATA3<0:31> and the second data word DATA3<32:63> of the third data DATA3 may be input to the third channel interface IF_CHC corresponding to the right interface, and respectively transferred as the first core data word DATA3'<0:31> and the second core data word DATA3'<32:63> to the TSV area 1122 of the core chip 112_x through the first through-electrode TSV13 and the second through-electrode TSV23.

The command decoder 310 of the third transfer control circuit 240 may decode the third command/address signal CA3 to generate the internal command/address signal ICA, the channel designation signal PC_ASS, and the channel seed command PC_CMD. The channel control circuit 320 of the third transfer control circuit 240 may sequentially output the channel seed command PC_CMD as the second channel command PC1_CMD and the first channel command PC0_CMD, according to the channel designation signal PC_ASS and the location information signal LOCATE_F having a logic low level.

The data transfer circuit 330 of the third transfer control circuit 240 may sequentially generate the second write control signal PC1_WTSTRP corresponding to the second channel command PC1_CMD, and the first write control signal PC0_WTSTRP corresponding to the first channel command PC0_CMD. The data transmission circuit 330 may output the aligned second data word DATA3_S<32:63> by aligning the second core data word DATA3'<32:63> according to 4-phase signals IDQS, IBDQS, QDQS, and QBDQS, which are generated by the second strobe signal DQS2'. Then, the data transmission circuit 330 may output the aligned first data word DATA3_S<0:31> by aligning the first core data word DATA3'<0:31> according to 4-phase signals IDQS, IBDQS, QDQS, and QBDQS, which are generated by the first strobe signal DQS1'. Finally, the data transmission circuit 330 may transmit the aligned second data word DATA3_S<32:63> as the second internal data word DIN3<32:63> in response to the second write control signal PC1_WTSTRP, and transmit the aligned first data word DATA3_S<0:31> as the first internal data word DIN3<0:31>> in response to the first write control signal PC0_WTSTRP.

As described above, when the channel interfaces of the physical area 1142 of the base chip 114 are disposed in a mirror structure but the channels of the core chip 1122 are disposed in a shift structure, the pseudo-channels included in the right channel of the TSV area 1122 of the core chip 112_x receive the first and second data words swapped with each other. In an embodiment of the present invention, the channel command PC0_CMD and PC1_CMD provided to the pseudo-channels included in the right channel may be swapped depending on the arrangement of the channel interfaces using the transfer control circuits 220 to 250 disposed in the TSV area 1122. Accordingly, the pseudo-channels included in the right channel may be controlled to transmit and receive the swapped data word according to the swapped channel command. By appropriately providing an interface between the base chip and the core chips, the skew that may occur in the signal transmission of the stacked semiconductor device may be minimized and operational reliability may be improved.

Figure 16:
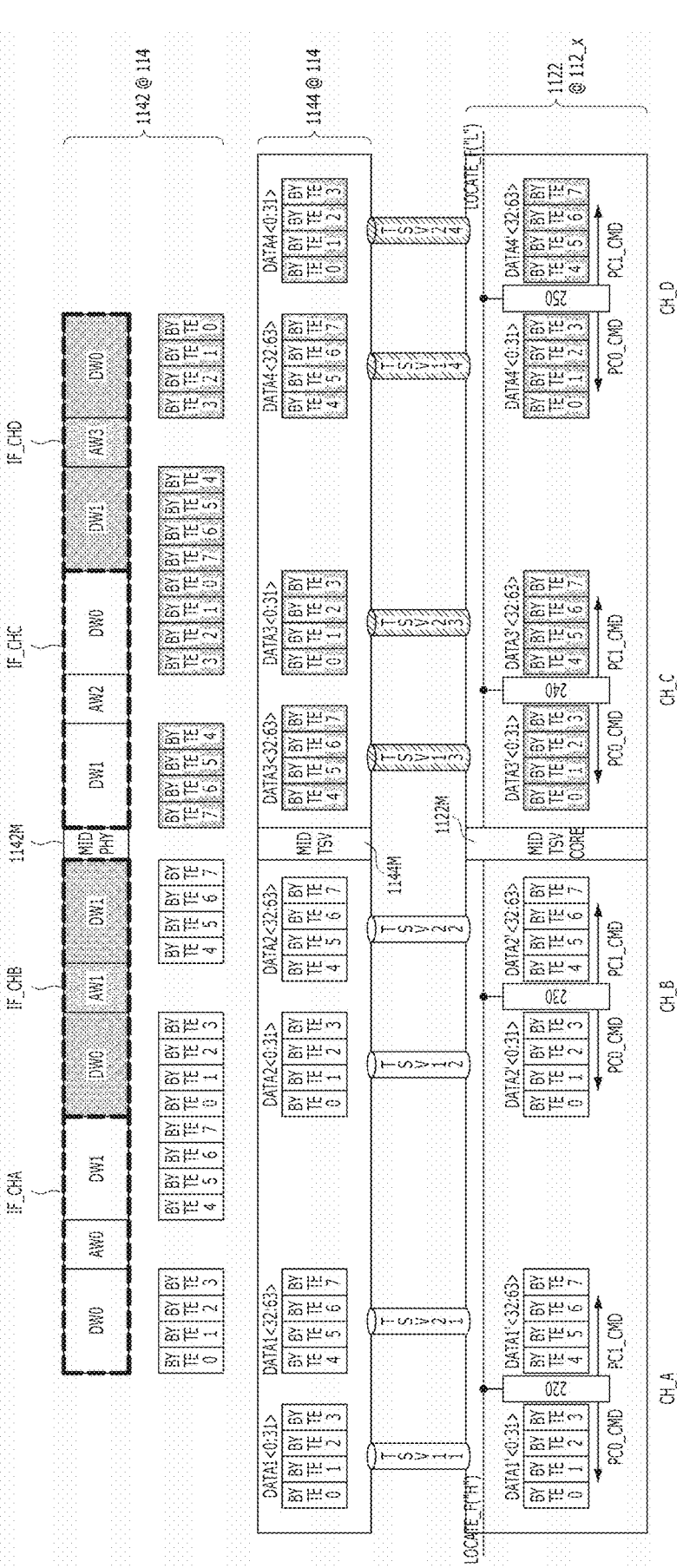
FIG. 16 is a diagram for describing a data transfer operation of a stacked memory device in accordance with an embodiment of the present invention.

FIG. 16 is a diagram for describing a data transfer operation of a stacked memory device 110 in accordance with various embodiments of the present invention.

Referring to FIG. 16, the first to fourth channel interfaces IF_CHA to IF_CHD may transmit and receive the first and second data words DW0 and DW1 and the address word AW #, where # is an integer from 0 to 3, respectively. For example, each of the data words DW0 and DW1 and the address word AW # may be input and output in units of 4 bytes (i.e., 32 bits), respectively. In the physical area 1142, data input and output through the left channel interfaces IF_CHA and IF_CHB and data input and output through the right channel interfaces IF_CHC and IF_CHD may have a mirror structure symmetrical to each other with respect to middle physical area 1142M.

In case of the left channel interfaces IF_CHA and IF_CHB, the repeater (1148 of FIG. 6) disposed between the physical area 1142 and the TSV area 1144 of the base chip 114 may output the first data word DW0 and the second data word DW1 input through each channel interface without changing a byte order. On the other hand, in case of the right channel interfaces IF_CHC and IF_CHD, the repeater 1148 may change a byte order of the first data word DW0 input with the descending order, into the ascending order (i.e., BYTE0, BYTE1, BYTE2, BYTE3), and change a byte order of the second data word DW1 input with the descending order, into the ascending order (i.e., BYTE4, BYTE5, BYTE6, BYTE7). Accordingly, in the left channel interfaces IF_CHA and IF_CHB and the right channel interfaces IF_CHC and IF_CHD, the byte order of each data word may be unified in the ascending order.

Thereafter, the first data word DATA1<0:31> and DATA2<0:31> from the left channel interfaces IF_CHA and IF_CHB are transmitted to the TSV area 1122 of the core chip 112_x through the first through-electrodes TSV11 and TSV12, as the first core data word DATA1'<0:31> and DATA2'<0:31>. The second data word DATA1<32:63> and DATA2<32:63> from the right channel interfaces IF_CHC and IF_CHD are transmitted to the TSV area 1122 through the second through-electrodes TSV21 and TSV22, as the second core data word DATA1'<32:63> and DATA2'<32:

63>. On the contrary, the second data word DATA3<32:63> and DATA4<32:63> from the right channel interfaces IF_CHC and IF_CHD are transmitted to the TSV area 1122 through the first through-electrodes TSV13 and TSV14, as the first core data word DATA3'<0:31> and DATA4'<0:31>. The first data word DATA3<0:31> and DATA4<0:31> from the right channel interfaces IF_CHC and IF_CHD are transmitted to the TSV area 1122 through the second through-electrodes TSV23 and TSV24, as the second core data word DATA3'<32:63> and DATA4'<32:63>.

The first to fourth transfer control circuits 220 to 250 of the core chip 112_x may control the first pseudo-channel PCH0 of each of the first to fourth channels CH_A to CH_D to transmit and receive the first core data word, and control the second pseudo-channel PCH1 of each of the first to fourth channels CH_A to CH_D to transmit and receive the second core data word, according to the location information signal LOCATE_F, which is determined by the arrangement of the first to fourth channel interfaces IF_CHA to IF_CHD.

According to the embodiments of the present teachings, in case of the left channel interface, the first data word DW0 and the second data word DW1 may be transmitted to the first pseudo-channel PCH0 and the second pseudo-channel PCH1, respectively. On the other hand, in case of the right channel interface, the first data word DW0 and the second data word DW1 may be swapped to be transmitted to the second pseudo-channel PCH1 and the first pseudo-channel PCH0, respectively. As a result, the first and second data words of the first to fourth data DATA1 to DATA4 input into the mirror structure may be selectively swapped and transferred to the core chip 112_x as the first to fourth core data DATA1' to DATA4' of the shift structure.

Hereinafter, according to another embodiment, a method of providing an interface between the base chip 114 having channel interfaces of a mirror structure and the core chips 112_x having channel interfaces of a shift structure will be described.

Figure 17:
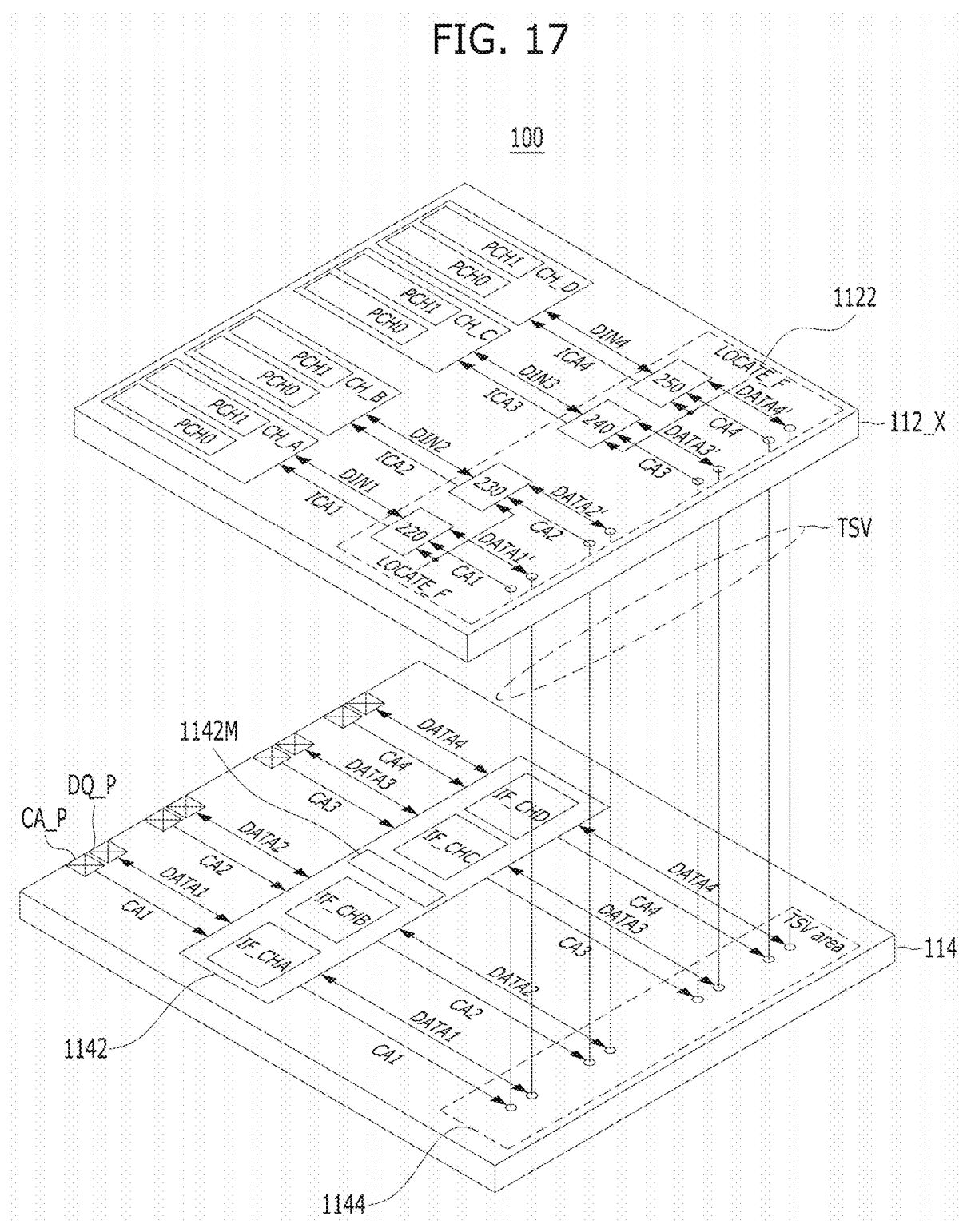
FIG. 17 is a configuration diagram illustrating a stacked memory device in accordance with another embodiment of the present invention.

FIG. 17 is a configuration diagram illustrating a stacked memory device 110 in accordance with another embodiment of the present invention.

Referring to FIG. 17, the stacked memory device 110 may include a base chip 114 and one or more core chips 112_x. In FIG. 17, for convenience of description, only one core chip 112_x among a plurality of core chips is illustrated.

The base chip 114 may be divided into a physical area 1142 and a TSV area 1144. In the physical area 1142, first to fourth channel interfaces IF_CHA to IF_CHD and a middle physical area 1142M may be disposed, and the first to fourth channel interfaces IF_CHA to IF_CHD may be divided into left channel interfaces IF_CHA and IF_CHB and right channel interfaces IF_CHC and IF_CHD based on the middle physical area 1142M. The first to fourth channel interfaces IF_CHA to IF_CHD may receive the first to fourth command/address signals CA1 to CA4 and the first to fourth data DATA1 to DATA4 through a command/address pad CA_P and a data pad DQ_P, respectively. Although not shown in FIG. 6, a direct access area (1146 of FIG. 3) may be additionally disposed on the base chip 114.

The base chip 114 may have substantially the same configuration as the base chip 114 described in FIG. 6, except for the repeater 1148. That is, the base chip 114 of FIG. 17 may transfer first and second data words to the core chip 112_x from each channel interface without changing a byte order, and may transfer first and second data words from the core chip 112_x to each channel interface without changing the byte order. A detailed operation regarding this will be described in detail with reference to FIG. 18.

The core chip 112_x may support first to fourth channels CH_A to CH_D among a plurality of channels, and each channel may include first and second pseudo-channels PCH0 and PCH1. Each of the first to fourth channels CH_A to CH_D may be disposed to be symmetrical with respect to a TSV area 1122. The core chip 112_x may include first to fourth transfer control circuits 220 to 250 disposed between through-electrodes TSV of the TSV area 1122 and the first to fourth channels CH_A to CH_D, respectively. The first to fourth transfer control circuits 220 to 250 may receive the first to fourth command/address signals CA1 to CA4 and the first to fourth core data DATA1' to DATA4', respectively. Each of the first to fourth transfer control circuits 220 to 250 may generate a channel designation signal (PC_ASS of FIG. 8) for designating the first and second pseudo-channels PCH0 and PCH1 according to a corresponding command/address signal of the first to fourth command/address signals CA1 to CA4, and output channel commands (PC0_CMD and PC1_CMD of FIG. 8) according to the channel designation signal PC_ASS and location information signal LOCATE_F indicating a location of a corresponding channel. The core chip 112_x may have substantially the same configuration as the core chip 112_x described in FIG. 6.

The base chip 114 and the core chip 112_x may communicate through through-electrodes TSV located in the TSV areas 1122 and 1144. Though FIG. 17 illustrates that each of the through-electrodes TSV is implemented as one through-electrode TSV, each of the through-electrodes TSV may be implemented in various numbers.

In another embodiment of the present invention, the channel interfaces of the physical area 1142 of the base chip 114 are disposed in a mirror structure while the channels of the core chip 1122 are disposed in a shift structure. The pseudo-channels in the right channel of the TSV area 1122 of the core chip 112_x receive the first and second data words swapped with each other. The channel command PC0_CMD and PC1_CMD provided to the pseudo-channels in the right channel may be swapped depending on the arrangement of the channel interfaces using the transfer control circuits 220 to 250 disposed in the TSV area 1122. Accordingly, the pseudo-channels included in the right channel may be controlled to transmit and receive the swapped data word according to the swapped channel command. By appropriately providing an interface between the base chip and the core chips, the skew that may occur in the signal transmission of the stacked semiconductor device may be minimized and operational reliability may be improved.

Figure 18:
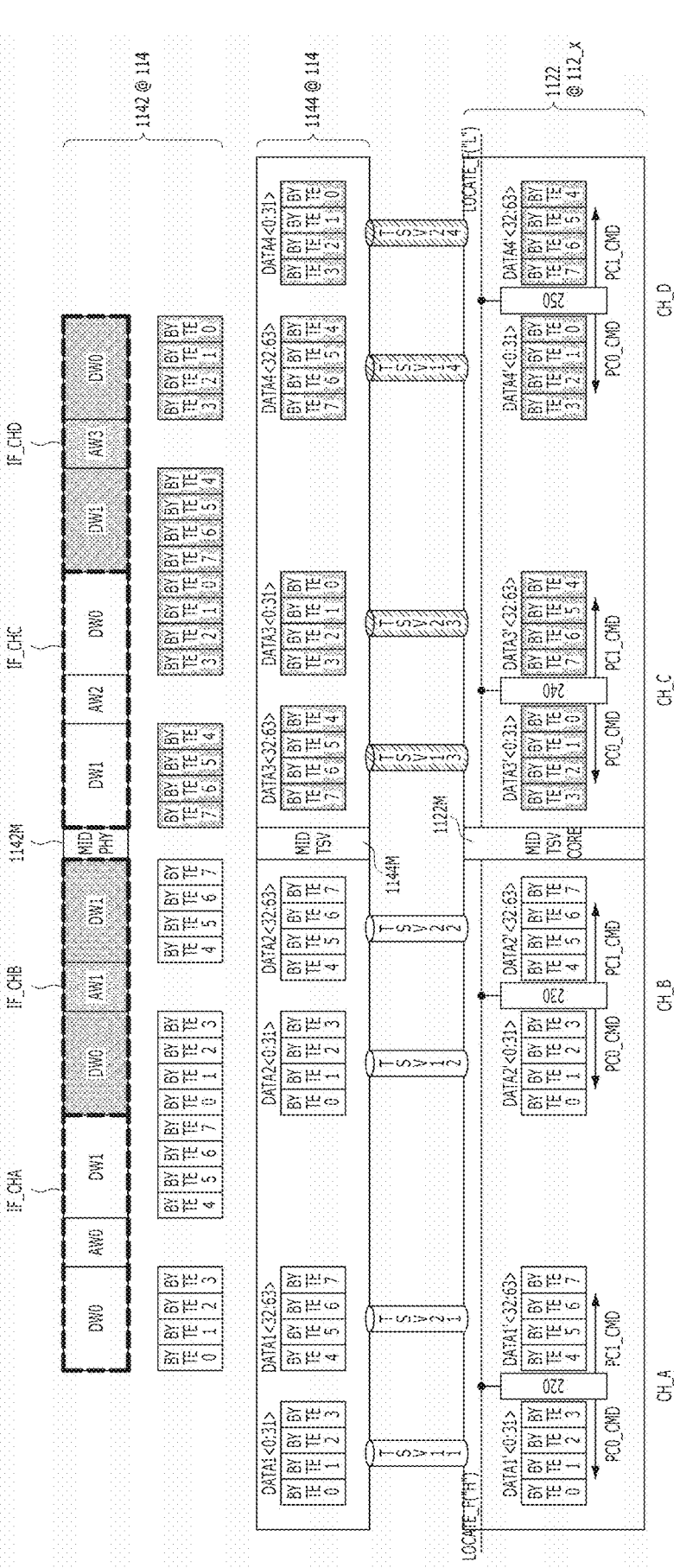
FIG. 18 is a diagram for describing a data transfer operation of the stacked memory device of FIG. 17.

FIG. 18 is a diagram for describing a data transfer operation of the stacked memory device 110 of FIG. 17.

Referring to FIG. 18, the first to fourth channel interfaces IF_CHA to IF_CHD may transmit and receive the first and second data words DW0 and DW1 and the address word AW #, where # is an integer from 0 to 3, respectively. For example, each of the data words DW0 and DW1 and the address word AW # may be input and output in units of 4 bytes (i.e., 32 bits), respectively. In the physical area 1142, data input and output through the left channel interfaces IF_CHA and IF_CHB and data input and output through the right channel interfaces IF_CHC and IF_CHD may have a mirror structure symmetrical to each other with respect to middle physical area 1142M.

In another embodiment, the first data word DW0 and the second data word DW1 input through each channel interface may be transferred to the TSV area 1144, without changing a byte order. That is, in case of the left channel interfaces IF_CHA and IF_CHB, the first data word DW0 may be transferred in a first order (i.e., an ascending order) in units of bytes (e.g., BYTE0, BYTE1, BYTE2, BYTE3), and the second data word DW1 may be transferred in the ascending order in units of bytes (e.g., BYTE4, BYTE5, BYTE6, BYTE7). On the contrary, in case of the right channel interfaces IF_CHC and IF_CHD, the first data word DW0 may be transferred in a second order (i.e., a descending order) opposite to the ascending order, in units of bytes (e.g., BYTE3, BYTE2, BYTE1, BYTE0), and the second data word DW1 may be transferred in the descending order in units of bytes (e.g., BYTE7, BYTE6, BYTE5, BYTE4). Accordingly, a byte order of each data word transferred by the left channel interfaces IF_CHA and IF_CHB may be opposite to a byte order of each data word transferred by the right channel interfaces IF_CHC and IF_CHD.

Thereafter, the first data word DATA1<0:31> and DATA2<0:31> from the left channel interfaces IF_CHA and IF_CHB are transmitted to the TSV area 1122 of the core chip 112_x through the first through-electrodes TSV11 and TSV12, as the first core data word DATA1'<0:31> and DATA2'<0:31>. The second data word DATA1<32:63> and DATA2<32:63> from the right channel interfaces IF_CHC and IF_CHD are transmitted to the TSV area 1122 through the second through-electrodes TSV21 and TSV22, as the second core data word DATA1'<32:63> and DATA2'<32:63>. On the contrary, the second data word DATA3<32:63> and DATA4<32:63> from the right channel interfaces IF_CHC and IF_CHD are transmitted to the TSV area 1122 through the first through-electrodes TSV13 and TSV14, as the first core data word DATA3'<0:31> and DATA4'<0:31>. The first data word DATA3<0:31> and DATA4<0:31> from the right channel interfaces IF_CHC and IF_CHD are transmitted to the TSV area 1122 through the second through-electrodes TSV23 and TSV24, as the second core data word DATA3'<32:63> and DATA4'<32:63>.

The first to fourth transfer control circuits 220 to 250 of the core chip 112_x may control the first pseudo-channel PCH0 of each of the first to fourth channels CH_A to CH_D to transmit and receive the first core data word, and control the second pseudo-channel PCH1 of each of the first to fourth channels CH_A to CH_D to transmit and receive the second core data word, according to the location information signal LOCATE_F, which is determined by the arrangement of the first to fourth channel interfaces IF_CHA to IF_CHD.

As a result, the first and second transfer control circuits 220 and 230 corresponding to the first and second channels CH_A and CH_B of the left channel interface may transfer the first core data word DATA1'<0:31> and DATA2'<0:31> and the second core data word DATA1'<32:63> and DATA2'<32:63>, in the ascending order in units of bytes. On the contrary, the third and fourth transfer control circuits 240 and 250 corresponding to the third and fourth channels CH_C and CH_D of the right channel interface may transfer the first core data word DATA3'<0:31> and DATA4'<0:31> and the second core data word DATA3'<32:63> and DATA4'<32:63>, in the descending order in units of bytes. CIP According to the embodiments of the present teachings, in case of the left channel interface, the first data word DW0 and the second data word DW1 may be transmitted to the first pseudo-channel PCH0 and the second pseudo-channel PCH1, respectively. On the other hand, in case of the right channel interface, the first data word DW0 and the second data word DW1 may be swapped to be transmitted to the second pseudo-channel PCH1 and the first pseudo-channel PCH0, respectively. As a result, the first and second data words of the first to fourth data DATA1 to DATA4 input into the mirror structure may be selectively swapped and transferred to the core chip 112_x as the first to fourth core data DATA1' to DATA4' of the shift structure.

While the present teachings have been described with respect to the specific embodiments, it will be apparent to those skilled in the art that various changes and modifications may be made without departing from the spirit and scope of the present teachings as defined in the following claims.

For example, the logic gates and transistors described in the above embodiments may have different positions and types according to the polarity of input signals. Furthermore, the embodiments may be combined to form additional embodiments.

What is claimed is:

1. A stacked semiconductor device, comprising:
at least one upper chip including
first and second channels, each including first and second pseudo-channels; and
first and second transfer control circuits respectively corresponding to the first and second channels, each configured to select one of the first and second pseudo-channels according to a channel designation signal designating one of the first and second pseudo-channels and a location information signal indicating a location of a corresponding channel, and transfer a data word between the selected pseudo-channel and a lower chip,
wherein the first transfer control circuit transfers the data word in a first order in units of bytes, and the second transfer control circuit transfers the data word in a second order in units of bytes, opposite to the first order.

2. The stacked semiconductor device of claim 1, wherein the first order includes an ascending order, and the second order includes a descending order.

3. The stacked semiconductor device of claim 1,
wherein the lower chip includes a first area interfacing with a controller and a second area interfacing with the upper chip through through-electrodes, and
wherein the first area includes first and second channel interfaces respectively corresponding to the first and second channels and divided into left and right channel interfaces, which have a mirror structure with reference to a middle of the first area.

4. The stacked semiconductor device of claim 1, wherein the lower chip includes a based chip of a high bandwidth memory (HBM).

5. The stacked semiconductor device of claim 1, wherein each of the first and second transfer control circuits includes:
a channel control circuit configured to output a channel seed command as one of a first channel command and a second channel command according to the channel designation signal and the location information signal; and
a data transfer circuit configured to transfer upper bits of the data word between the first pseudo-channel and the lower chip according to the first channel command, and transfer lower bits of the data word between the second pseudo-channel and the lower chip according to the second channel command.

6. The stacked semiconductor device of claim 5, wherein each of the first and second transfer control circuits further includes:
a command decoder configured to decode a command/address signal input from the lower chip to generate the channel designation signal and the channel seed command.

7. The stacked semiconductor device of claim 5, wherein the channel control circuit includes:
a swap control circuit configured to transmit the channel designation signal as one of a first swap control signal and a second swap control signal according to the location information signal; and
a command setting circuit configured to set the channel seed command to the first channel command or the second channel command according to the first swap control signal and the second swap control signal.

8. The stacked semiconductor device of claim 7, wherein the swap control circuit includes:
a first swap circuit configured to output, as the first swap control signal, the channel designation signal when the location information signal is a first logic level, and an inverted signal of the channel designation signal when the location information signal is a second logic level; and
a second swap circuit configured to output, as the second swap control signal, an inverted signal of the channel designation signal when the location information signal is the first logic level, and the channel designation signal when the location information signal is the second logic level.

9. The stacked semiconductor device of claim 7, wherein the command setting circuit includes:
a first setting circuit configured to output the channel seed command as the first channel command when the second swap control signal is enabled; and
a second setting circuit configured to output the channel seed command as the second channel command when the first swap control signal is enabled.

10. The stacked semiconductor device of claim 5, wherein the data transfer circuit includes:
a control signal generation circuit configured to generate first write and read control signals, which correspond to the first channel command, and second write and read control signals, which correspond to the second channel command;
a first data input/output (I/O) circuit configured to transmit the upper bits to the first pseudo-channel according to the first write control signal, and transfer the upper bits from the first pseudo-channel to the lower chip according to the first read control signal; and
a second data I/O circuit configured to transmit the lower bits to the second pseudo-channel according to the second write control signal, and transfer the lower bits from the second pseudo-channel to the lower chip according to the second read control signal.

11. A semiconductor device comprising:
a first chip including first and second interfaces each configured to transfer a data word to or from an exterior; and
a second chip including:
first and second channels, each having first and second pseudo-channels; and
first and second transfer control circuits corresponding to the respective first and second interfaces, each configured to select, based on a channel designation signal indicating one of the first and second pseudo-channels within a corresponding channel, one of the first and second pseudo-channels according to a location of the corresponding interface, and transfer the data word between the selected pseudo-channel and the corresponding interface,
wherein the data word is transferred by the first interface between the first chip and the second chip in a first order in units of bytes, and the data word is transferred by the second interface between the first chip and the second chip in a second order in units of bytes, opposite to the first order.

12. The semiconductor device of claim 11, wherein the first order includes an ascending order, and the second order includes a descending order.

13. The semiconductor device of claim 11, wherein the first transfer control circuit transfers the data word in the first order in units of bytes, and the second transfer control circuit transfers the data word in the second order in units of bytes.

14. The semiconductor device of claim 11, wherein the data word transferred by the first interface is symmetrical, in units of bytes, to the data word transferred by the second interface.

15. The semiconductor device of claim 11, wherein the first interface transfers the data word in the first order in units of bytes, and the second interface transfers the data word in the second order in units of bytes.

* * * * *